(12) United States Patent
Snyder

(10) Patent No.: US 11,744,042 B2
(45) Date of Patent: Aug. 29, 2023

(54) THERMAL MANAGEMENT SYSTEM WITH DUAL-USE SERIAL THERMAL ENERGY STORAGE FOR SYSTEM SIZE REDUCTION

(71) Applicant: Rolls-Royce North American Technologies Inc., Indianapolis, IN (US)

(72) Inventor: Douglas J. Snyder, Carmel, IN (US)

(73) Assignee: Rolls-Royce North American Technologies Inc., Indianapolis, IN (US)

(*) Notice: Subject to any disclaimer, the term of this patent is extended or adjusted under 35 U.S.C. 154(b) by 296 days.

(21) Appl. No.: 17/091,291

(22) Filed: Nov. 6, 2020

(65) Prior Publication Data

US 2022/0151102 A1 May 12, 2022

(51) Int. Cl.
| | |
|---|---|
| *F25B 25/00* | (2006.01) |
| *F25B 7/00* | (2006.01) |
| *H05K 7/20* | (2006.01) |
| *F25B 41/22* | (2021.01) |

(52) U.S. Cl.
CPC .......... *H05K 7/20318* (2013.01); *F25B 7/00* (2013.01); *F25B 25/005* (2013.01); *F25B 41/22* (2021.01); *H05K 7/20309* (2013.01); *H05K 7/20327* (2013.01); *H05K 7/20354* (2013.01); *H05K 7/20381* (2013.01)

(58) Field of Classification Search
CPC .......... F25B 41/22; F25B 7/00; F25B 25/005; F25B 2400/24; H05K 7/20381
See application file for complete search history.

(56) References Cited

U.S. PATENT DOCUMENTS

| | | | |
|---|---|---|---|
| 10,053,222 B2 | 8/2018 | Snyder | |
| 10,081,439 B1 | 9/2018 | Bowman et al. | |
| 10,384,792 B2 | 8/2019 | Snyder | |
| 10,746,440 B2* | 8/2020 | Donovan | F25B 40/00 |
| 11,591,102 B2* | 2/2023 | Snyder | B64D 37/34 |
| 2006/0070385 A1* | 4/2006 | Narayanamurthy | F25D 16/00 62/434 |
| 2009/0133412 A1* | 5/2009 | Narayanamurthy | F25D 16/00 62/66 |
| 2018/0155046 A1 | 6/2018 | Bowman et al. | |
| 2019/0314945 A1 | 10/2019 | Jansen et al. | |
| 2019/0316817 A1* | 10/2019 | Donovan | F25B 23/00 |
| 2021/0231388 A1* | 7/2021 | Rockenfeller | F25D 17/02 |

* cited by examiner

*Primary Examiner* — Miguel A Diaz
(74) *Attorney, Agent, or Firm* — Crowell & Moring LLP

(57) ABSTRACT

Thermal management systems for cooling high-power, low-duty-cycle thermal loads by rejecting heat from the thermal loads to the ambient environment are provided. The thermal management systems include a two-phase pump loop in fluid communication with a vapor compression system loop, evaporators disposed in parallel between the two-phase pump loop and the vapor compression system loop, and a thermal energy storage loop including a cold-temperature tank and a warm-temperature tank thermally coupled to the two-phase pump loop and the vapor-compression system loop. Methods of transferring heat from one or more thermal loads to an ambient environment are also provided.

20 Claims, 5 Drawing Sheets

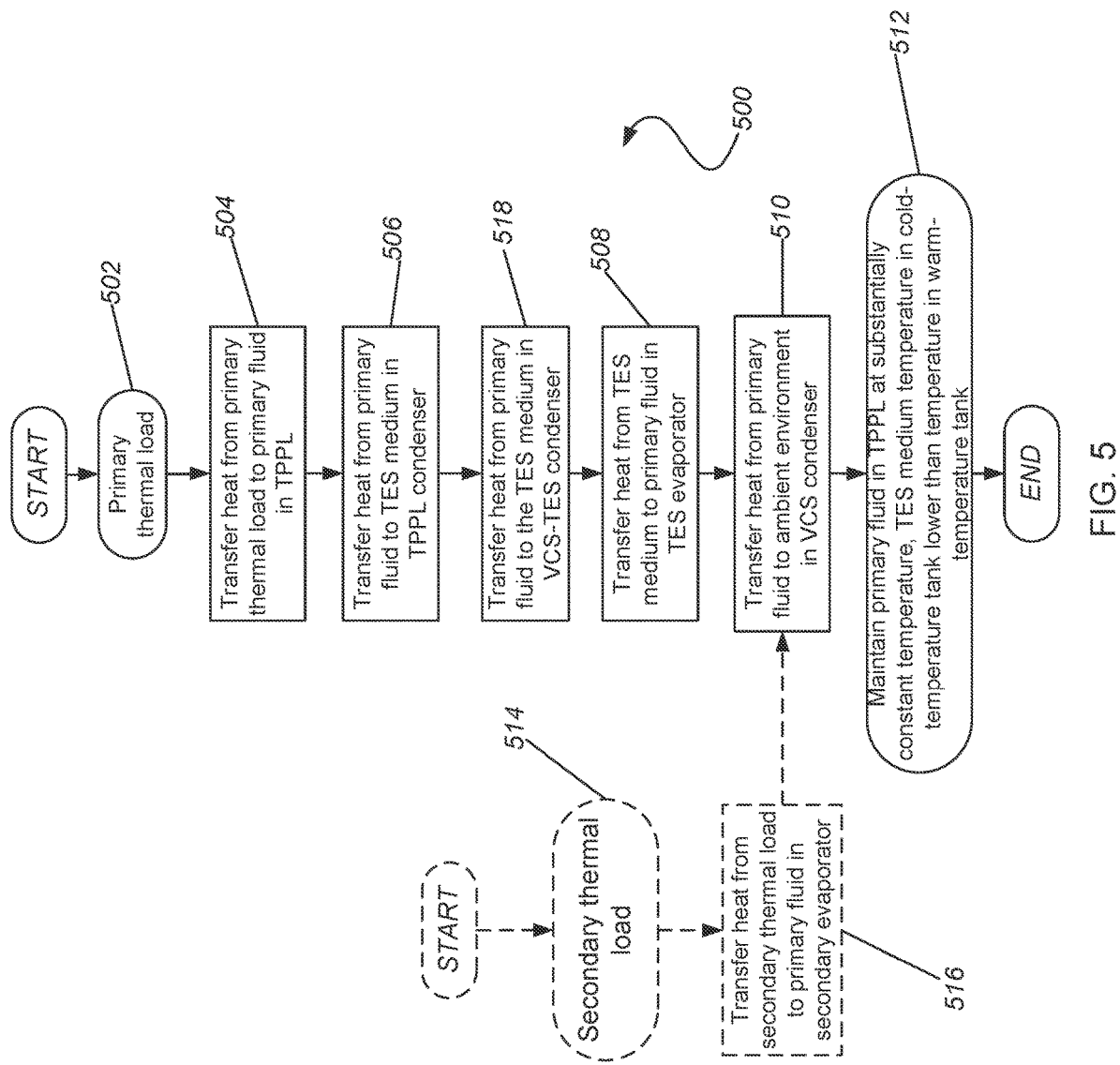

THERMAL MANAGEMENT SYSTEM WITH DUAL-USE SERIAL THERMAL ENERGY STORAGE FOR SYSTEM SIZE REDUCTION

TECHNICAL FIELD

This disclosure relates to thermal management systems, and more specifically to a thermal management system for cooling transient heat loads and sustained steady-state heat loads with reduced system size.

BACKGROUND

Conventional methods of rejecting heat from a refrigerant or cooling system, for example, phase change cooling systems, may require sizing the heat rejection component(s), for example, the condenser and fans, for a maximum design heat load at a maximum design rejection temperature. Many thermal management systems include large and heavy components in order to support transient heat loads that operate at low or medium duty cycles, requiring high power. Accordingly, there remains a need for further contributions in this area of technology.

BRIEF DESCRIPTION OF THE DRAWINGS

The present disclosure may be better understood with reference to the following drawings and description. The components in the figures are not necessarily to scale. Moreover, in the figures, like-referenced numerals designate corresponding parts throughout the different views.

FIG. 5 illustrates an example of a flow diagram of operations of a thermal management system.

Figure 1:
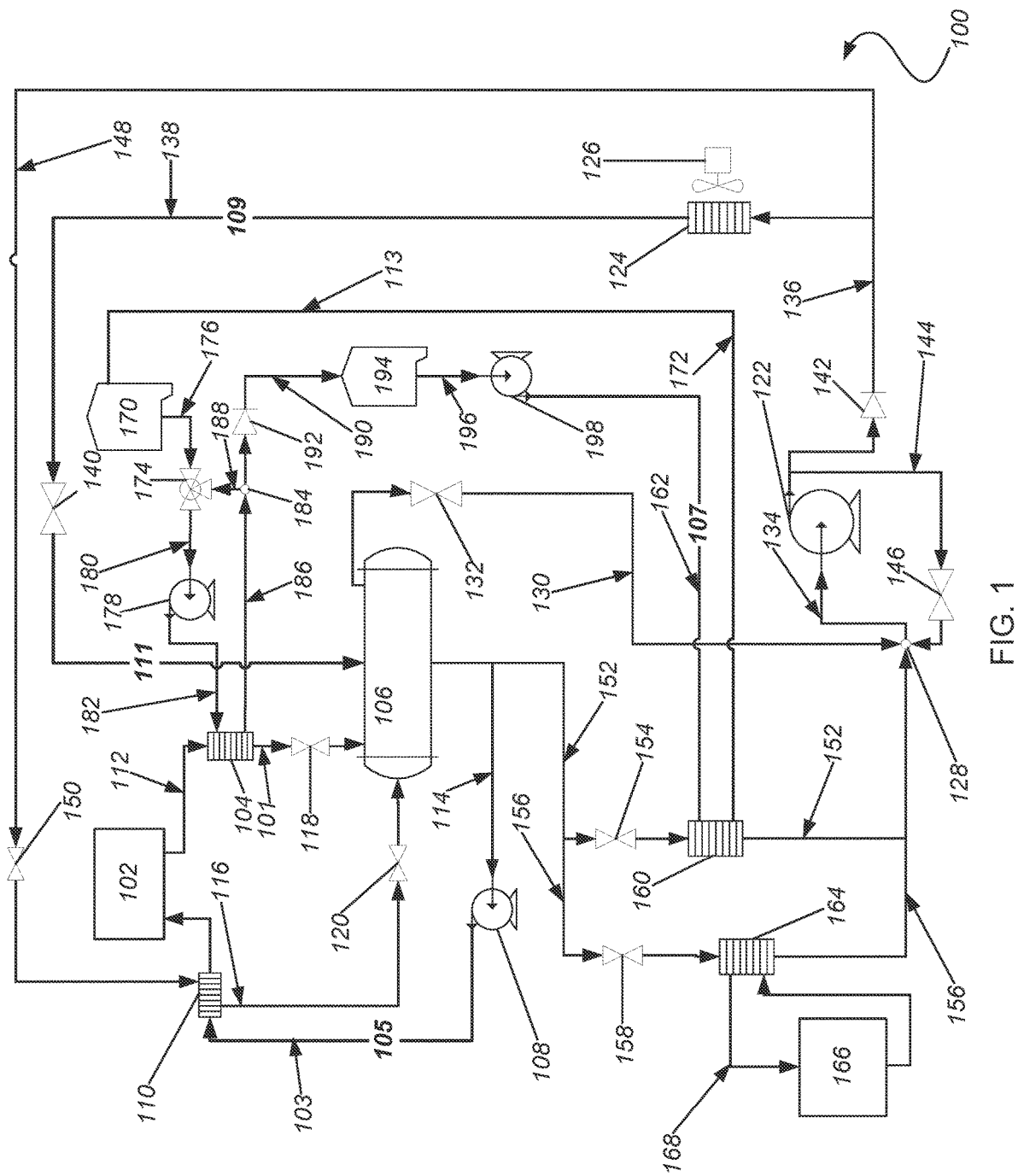
FIG. 1 illustrates a schematic of an example of a thermal management system according to the principles of the present disclosure.

The drawings described herein are for illustration purposes only and are not intended to limit the scope of the present disclosure in any way.

DETAILED DESCRIPTION

According to an example of the present disclosure, a thermal management system includes a thermal energy storage ("TES") loop including a TES medium disposed in the TES loop, a TPPL condenser, a first tank, a first liquid pump, a first TES evaporator, a second tank, and a second liquid pump. The thermal management system further includes a primary fluid flow path including a primary fluid disposed in the primary fluid flow path, a two-phase pump loop ("TPPL"), a vapor compression system ("VCS") loop, an accumulator, and a first-TES-evaporator branch. The primary fluid flow path further includes a two-phase pump loop ("TPPL"), the TPPL configured to cool a primary thermal load. The TPPL is configured to cool a primary thermal load, the TPPL comprising a TPPL liquid pump and the TPPL condenser, the TPPL condenser configured to transfer heat from the primary fluid in the TPPL to the TES medium. The VCS loop is configured to transfer heat from the primary fluid in the primary fluid flow path to an ambient environment via a VCS condenser. The accumulator is configured to separate the primary fluid into a vapor-phase primary fluid and a liquid-phase primary fluid. The first-TES-evaporator branch includes the first TES evaporator and is in fluid communication with the TPPL downstream of the accumulator and with the VCS loop upstream of the compressor, wherein the first TES evaporator is configured to transfer heat from the TES medium to the VCS loop. The TES loop is configured to, during operation of the thermal management system, transfer heat to the ambient environment via the VCS loop, and maintain the primary fluid supplied to the primary thermal load in the TPPL at a substantially constant temperature. The VCS loop and the TES loop are configured to, during operation of the thermal management system, maintain the TES medium in the second tank at a temperature that is lower than a temperature of the TES medium in the first tank.

Such a thermal management system may be smaller and/or weigh less than many conventional thermal management systems having similar capabilities.

For purposes of promoting an understanding of the principles of the disclosure, reference will now be made to the examples illustrated in the drawings, and specific language may be used to describe the same. It will nonetheless be understood that no limitation of the scope of the disclosure is intended by the illustration and description of certain examples of the disclosure. In addition, any alterations and/or modifications of the illustrated and/or described example(s) are contemplated as being within the scope of the present disclosure. Further, any other applications of the principles of the disclosure, as illustrated and/or described herein, as would normally occur to one skilled in the art to which the disclosure pertains, contemplated as being within the scope of the present disclosure.

FIG. 1 illustrates a schematic of an example of a thermal management system 100 to cool a transient heat load, for example, primary thermal load 102, and a steady-state load, for example, a secondary thermal load 166. Thermal management system 100 includes a primary fluid flow path 111 that includes one or more loops that are in fluid communication with one another. In the illustrated example, primary fluid flow path 111 includes the primary thermal load 102 disposed thereon. Primary fluid flow path 111 includes a primary fluid disposed in primary fluid flow path 111 that may include, at varying locations in primary fluid flow path 111, a liquid-phase primary fluid, a vapor-phase primary fluid, or a mixture of liquid- and vapor-phase primary fluid. The primary fluid may advantageously absorb heat from primary thermal load 102 through the latent heat of vaporization. Thermal management system 100 further includes thermal energy storage ("TES") loop 113 that is thermally coupled to primary fluid flow path 111. TES loop 113 includes a TES medium disposed in TES loop 113 that may absorb heat from one or more loops of primary fluid flow path 111 and may transfer, or reject, heat to another loop of primary fluid flow path 111. TES loop 113 may further include TES medium flow path 107. Thermal management system 100 further includes a secondary load cooling loop 168. Secondary load cooling loop 168 includes secondary thermal load 166 disposed thereon. Secondary load cooling loop 168 further includes a secondary fluid disposed thereon. Each of primary fluid flow path 111 (including each loop of primary fluid flow path 111), TES loop 113, TES medium flow path 107, and secondary load cooling loop 168 may include various components configured to transfer heat from one location and dispose of, or reject, the heat into another location.

For example, one loop of primary fluid flow path 111 is two-phase pump ("TPP") loop 105 ("TPPL" or "TPP loop"). Various components of TPP loop 105 of primary fluid flow path 111 may include primary thermal load 102, TPPL condenser 104, accumulator 106, TPPL liquid pump 108, and preheater 110. TPP loop 105 may be arranged such that each subsequent component, as listed in the order above, may be located downstream of the prior components, and the effluent of preheater 110 ultimately being returned to TPPL condenser 104 after flowing around TPP loop 105. TPP loop 105 may further include a subcooler (not shown in FIG. 1 or 2). TPPL condenser 104 may include a first TPPL condenser inlet, a first TPPL condenser outlet, a second TPPL condenser inlet, and a second TPPL condenser outlet. Accumulator 106 may include a first accumulator inlet, a second accumulator inlet, a third accumulator inlet, a first accumulator outlet, and a second accumulator outlet. TPPL liquid pump 108 may include a TPPL liquid pump inlet and a TPPL liquid pump outlet. Preheater 110 may include a first preheater inlet, a first preheater outlet, a second preheater inlet, and a second preheater outlet. TPP loop 105 may be configured to pump liquid from accumulator 106 and to deliver liquid-phase primary fluid to primary thermal load 102 at a substantially constant temperature.

Each of the above various components forming TPP loop 105 may be in fluid communication with, and/or coupled to, one another via one or more conduits. For example, the first TPPL condenser outlet may be in fluid communication with, and/or coupled to, the first accumulator inlet by TPPL-condenser-accumulator conduit 101; the first accumulator outlet may be in fluid communication with, and/or coupled to, the TPPL liquid pump inlet by accumulator-TPPL-liquid-pump conduit 114; the TPPL liquid pump outlet may be in fluid communication with, and/or coupled to, first preheater inlet by TPPL-liquid-pump-preheater conduit 103; and the first preheater outlet may be in fluid communication with, and/or coupled to, first TPPL condenser inlet by preheater-TPPL-condenser conduit 112. Primary thermal load 102 may be disposed on preheater-TPPL-condenser conduit 112.

Another loop of primary fluid flow path 111 is vapor compression system ("VCS") loop 109, which may be additionally referred to as a "first VCS loop." Various components of VCS loop 109 of primary fluid flow path 111, or the "VCS vapor-phase primary fluid flow path," may include accumulator 106, compressor 122, VCS condenser 124. VCS loop 109 may be arranged such that each subsequent component, as listed in the order above, may be located downstream of the prior components, and the effluent of VCS condenser 124 ultimately being returned to accumulator 106 after flowing around VCS loop 109. Compressor 122 may include a compressor inlet and a compressor outlet. VCS condenser 124 may include a VCS condenser inlet and a VCS condenser outlet. VCS loop 109 may be configured to compress vapor-phase primary fluid and transfer heat from the vapor-phase primary fluid to an ambient environment via VCS condenser 124.

The term "ambient environment" may refer to space immediately adjacent to and/or surrounding a thermal management system of the present disclosure such as thermal management system 100. Alternatively, or in addition, the term "ambient environment" may refer to space outside of a thermal management system of the present disclosure that is thermally coupled to at least one component of thermal management system 100. Examples of an "ambient environment" may include a ram air duct or a fan bypass duct on an aircraft, or air or seawater. The term "ambient temperature" may refer to the temperature of the air or other fluid in the ambient environment.

Each of the above various components forming VCS loop 109 may be in fluid communication with, and/or coupled to, one another via one or more conduits. For example, the second accumulator outlet may be in fluid communication with the compressor inlet by second-accumulator-outlet conduit 130 and compressor-inlet conduit 134. Conduit junction 128 may be disposed between second-accumulator-outlet conduit 130 and compressor-inlet conduit 134 such that conduit junction 128 may be in fluid communication with, and/or coupled to, each of second-accumulator-outlet conduit 130 and compressor-inlet conduit 134. The compressor outlet may in fluid communication with, and/or coupled to, the VCS condenser inlet by compressor-VCS-condenser conduit 136. The VCS condenser outlet may be in fluid communication with, and/or coupled to, the second accumulator inlet by VCS-condenser-accumulator conduit 138. VCS loop 109 may further include return conduit 116 disposed between second preheater outlet and third accumulator inlet such that return conduit 116 is in fluid communication with, and/or coupled to, each of second preheater outlet and third accumulator inlet.

The primary fluid disposed within primary fluid flow path 111 may be any appropriate fluid, including a vapor, a liquid, or a vapor-liquid mixture. In other words, the primary fluid may be any substance having a vapor-phase to liquid-phase transition temperature that is in the range of the temperature at which the primary thermal load 102 is desired to be maintained. The primary fluid may, without limitation, be suitable for use in a coolant and/or refrigeration system. Examples of the primary fluid may include, but are not limited to, a chlorofluorocarbon ("CFC"), a hydrochlorofluorocarbon ("HCFC"), a hydrofluorocarbon ("HFC"), difluoromethane, difluoroethane, or a combination thereof. Additional examples of the primary fluid may include R134a, R236fa, methanol, ammonia, or carbon dioxide ($CO_2$).

Primary fluid flow path 111 further includes one or more conduits or branches disposed between TPP loop 105 and VCS loop 109. For example, primary fluid flow path 111 may further include TES-evaporator conduit 152, also referred to as a TES-evaporator "branch," disposed between accumulator-TPPL-liquid-pump conduit 114 and conduit junction 128 and may be in fluid communication with, and/or coupled to, each of accumulator-TPPL-liquid-pump conduit 114 and conduit junction 128. TES evaporator 160 may be disposed on TES-evaporator conduit 152. TES evaporator 160 may include a first TES evaporator inlet, a first TES evaporator outlet, a second TES evaporator inlet, and a second TES evaporator outlet. First TES evaporator inlet and first TES evaporator outlet may be in fluid communication with, and/or coupled to, TES-evaporator conduit 152. Primary fluid flow path 111 may further include secondary-evaporator conduit 156, also referred to as a secondary-evaporator "branch," in fluid communication with, and/or coupled to, TES-evaporator conduit 152 upstream and downstream of TES evaporator 160.

Secondary evaporator 164 is disposed on secondary-evaporator conduit 156 in parallel to TES evaporator 160. Secondary evaporator 164 may include a first secondary evaporator inlet, a first secondary evaporator outlet, a second secondary evaporator inlet, and a second secondary evaporator outlet. First secondary evaporator inlet and first secondary evaporator outlet may be in fluid communication with, and/or coupled to, secondary-evaporator conduit 156. Primary fluid flow path 111 may further include VCS-loop-preheater conduit 148 disposed between compressor-VCS-condenser conduit 136 and the second preheater inlet of preheater 110, and may be in fluid communication with, and/or coupled to, each of compressor-VCS-condenser conduit 136 and the second preheater inlet of preheater 110. Primary fluid flow path 111 may further include vapor-return conduit 144 disposed between compressor-VCS-condenser conduit 136, which is upstream of VCS-loop-preheater conduit 148, and conduit junction 128. Vapor-return conduit 144 may be in fluid communication with, and/or coupled to, each of compressor-VCS-condenser conduit 136 and conduit junction 128.

Primary fluid flow path 111 may include one or more valves disposed within the conduits of primary fluid flow path 111 at preferable locations. For example, TPPL-condenser-accumulator conduit 101 may include back-pressure regulator 118 disposed thereon. Return conduit 116 may include return conduit modulating valve 120 disposed thereon. Second-accumulator-outlet conduit 130 may include back-pressure regulator 132 disposed thereon. Compressor-VCS-condenser conduit 136 may include valve 142 disposed thereon, downstream of vapor-return conduit 144 and upstream of VCS-loop-preheater conduit 148. In other examples, valve 142 may be downstream of outlet of compressor 122 and upstream of vapor-return conduit 144. Valve 142 may be a check valve. VCS-loop-preheater conduit 148 may include modulating valve 150 disposed thereon, configured to control flow of primary fluid to preheater 110. VCS-condenser-accumulator conduit 138 may include expansion valve 140 disposed thereon. Examples of expansion valve 140 may include a back-pressure regulator, a thermal expansion valve, and an electronic expansion valve. Vapor-return conduit 144 may include modulating valve 146 disposed thereon. TES-evaporator conduit 152 may include expansion valve 154 disposed thereon, downstream of secondary-evaporator conduit 156 and upstream of TES evaporator 160. Expansion valve 154 may be a thermal expansion valve or an electronic expansion valve. Secondary-evaporator conduit 156 may include expansion valve 158 disposed thereon, upstream of secondary evaporator 164. Examples of expansion valve 158 may include a thermal expansion valve and an electronic expansion valve. Each of modulating valve 120, modulating valve 146, and modulating valve 150 may be a flow control valve. Each of modulating valve 120, modulating valve 146, and modulating valve 150 may independently and separately be open, partially open, or closed so as to advantageously adjust flow of primary fluid on primary fluid flow path 111.

TES loop 113 may operate as a low-temperature sink for TPP loop 105, and operate as a heat source for TES evaporator 160, and consequently, VCS loop 109. Accordingly, TES loop 113 is configured to transfer heat from TPP loop 105 to the TES medium, and then at a later time to transfer heat from the TES medium, to VCS loop 109. TES loop 113 may be in fluid communication with the second TPPL condenser inlet, the second TPPL condenser outlet, the second TES evaporator inlet, and the second TES evaporator outlet. Accordingly, TES loop 113 is thermally coupled to primary fluid flow path 111 by each of TPPL condenser 104 and TES evaporator 160. TES loop 113 or TES medium flow path 107 includes various components configured to transfer heat from one location and dispose of, or reject, the heat into another location. For example, various components of TES loop 113 may TPPL condenser 104, warm-temperature tank 194, warm-temperature liquid pump 198, TES evaporator 160, cold-temperature tank 170, mix valve 174, and cold-temperature liquid pump 178. Warm-temperature tank 194 may also be referred to as a "first tank." Warm-temperature liquid pump 198 may also be referred to as a "first liquid pump." TES evaporator 160 may also be referred to as a "first TES evaporator." Cold-temperature tank 170 may also be referred to as a "second tank." Cold-temperature liquid pump 178 may also be referred to as a "second liquid pump." TES loop 113 may be arranged such that each subsequent component, as listed in the order above, may be located downstream of the prior components, and the effluent of cold-temperature liquid pump 178 ultimately being returned to the second TPPL condenser inlet after flowing around TES loop 113. Warm-temperature tank 194 may include a warm-temperature tank inlet, a warm-temperature tank outlet, and one or more sensors to detect depth of the TES medium in warm-temperature tank 194 at one or more respective predetermined set points. Warm-temperature liquid pump 198 may include a warm-temperature liquid pump inlet and a warm-temperature liquid pump outlet. Cold-temperature tank 170 may include a cold-temperature tank inlet, a cold-temperature tank outlet, and one or more sensors to detect depth of the TES medium in cold-temperature tank 170 at one or more respective predetermined set points. Cold-temperature liquid pump 178 may include a cold-temperature liquid pump inlet and a cold-temperature liquid pump outlet. TES loop 113 may be configured to maintain a temperature of the TES medium in cold-temperature tank 170 lower than a temperature of the TES medium in warm-temperature tank 194.

Each of the above components forming TES loop 113 may be in fluid communication with, and/or coupled to, one another via one or more conduits. The second TPPL condenser outlet may be in fluid communication with, and/or coupled to, warm-temperature tank 194, by second-TPPL-condenser-outlet conduit 186 and warm-temperature-tank-inlet conduit 190. Conduit junction 184 may be disposed between second-TPPL-condenser-outlet conduit 186 and warm-temperature-tank-inlet conduit 190 such that conduit junction 184 may be in fluid communication with, and/or coupled to, each of second-TPPL-condenser-outlet conduit 186 and warm-temperature-tank-inlet conduit 190. The warm-temperature tank outlet may be in fluid communication with, and/or coupled to, the warm-temperature liquid pump inlet by warm-tank-liquid-pump conduit 196. The warm-temperature liquid pump outlet may be in fluid communication with, and/or coupled to, the second TES evaporator inlet by liquid-pump-TES-evaporator conduit 162. The second TES evaporator outlet may be in fluid communication with, and/or coupled to, the cold-temperature tank inlet by TES-evaporator-cold-tank conduit 172. The cold-temperature tank outlet may be in fluid communication with, and/or coupled to, mix valve 174 by cold-temperature-tank-mix-valve conduit 176. Mix valve 174 may be in fluid communication with, and/or coupled to, the cold-temperature liquid pump inlet by mix-valve-liquid-pump conduit 180. The cold-temperature liquid pump outlet may be in fluid communication with, and/or coupled to, the second TPPL condenser inlet by liquid-pump-TPPL-condenser conduit 182. Conduit junction 184 may be in fluid communication with, and/or coupled to, mix valve 174 by junction-mix-valve conduit 188. Mix valve 174 may be configured to control the temperature of the TES medium that flows to TPPL condenser 104 by mixing the TES medium flowing from TPPL condenser 104 through junction-mix-valve conduit 188 with the TES medium from cold-temperature tank 170. The temperature of the TES medium flowing to TPPL condenser 104 may consequently determine the amount of heat that is transferred in TPPL condenser 104. Valve 192 may be disposed on warm-temperature-tank-inlet conduit 190. Valve 192 may be a passive check valve with a cracking pressure.

Secondary load cooling loop 168 may include a pump (not shown in FIGS. 1 through 4). The secondary fluid may have a temperature in secondary evaporator 164 that is higher than the saturation temperature of the primary fluid.

TPPL condenser 104 may be a heat exchanger that rejects heat from the primary fluid to a heat sink, which may be, for example, the TES medium. Examples of TPPL condenser 104 may include a parallel-flow, counter-flow, multi-pass-flow, and cross-flow heat exchanger. The primary fluid may run in hot-side channels of TPPL condenser 104, and more specifically, the primary fluid may be received through the first TPPL condenser inlet and flow out through the first TPPL condenser outlet. Cold-side channels of TPPL condenser 104 may be filled with the TES medium, and more specifically TES medium may be received through the second TPPL condenser inlet and flow out through the second TPPL condenser outlet.

VCS condenser 124 may receive the higher-temperature/pressure primary fluid from compressor 122. VCS condenser 124 may be a heat exchanger that rejects heat from the primary fluid to a heat sink, which may be, for example, the ambient environment. Examples of VCS condenser 124 may include a parallel-flow, counter-flow, multi-pass-flow, and cross-flow heat exchanger. The primary fluid may run in hot-side channels of VCS condenser 124. Cold-side channels of VCS condenser 124 may be filled with a fluid from a heat sink, for example, ambient air. VCS condenser 124 may include a force ventilation unit, such as fan 126, which may increase the flow rate of the heat sink over VCS condenser 124. The "sizing" of VCS condenser 124 may factor in the addition of the force ventilation unit, such as fan 126. In some examples, the VCS condenser 124 may also include one or more pumps for rejecting heat, for example, to water.

Accumulator 106 may be a reservoir that performs many functions in thermal management system 100, including, but not limited to: providing a flow of primary fluid to TPPL liquid pump 108, TES evaporator 160, and secondary evaporator 164; providing pump head to TPPL liquid pump 108; and separating two-phase (in other words, vapor-liquid) mixtures of the primary fluid into vapor-phase primary fluid and liquid-phase primary fluid. The liquid-phase primary fluid flows into accumulator-TPPL-liquid-pump conduit 114, TES-evaporator conduit 152, and secondary-evaporator conduit 156. The vapor-phase primary fluid flows into second-accumulator-outlet conduit 130. Two-phase or liquid-phase primary fluid leaving preheater 110 may flow into accumulator 106 along return conduit 116, and along TPPL-condenser-accumulator conduit 101, downstream from primary thermal load 102, and along VCS-condenser-accumulator conduit 138, for subsequent reuse in accumulator-TPPL-liquid-pump conduit 114, TES-evaporator conduit 152, and secondary-evaporator conduit 156.

TPPL liquid pump 108 may raise the pressure of the primary fluid and may provide workflow to move the primary fluid downstream within TPPL-liquid-pump-preheater conduit 103.

Preheater 110 may increase the temperature of the primary fluid flowing in TPP loop 105 through the preheater cold-side channels to a predetermined set point temperature before the primary fluid flows through primary thermal load 102. The primary fluid flowing through the cold-side channels is warmed by the primary fluid in the hot-side channels of preheater 110, which flows through VCS-loop-preheater conduit 148. After warming the primary fluid in the cold-side channels of preheater 110, the primary fluid in the hot-side channels of preheater 110 flows through return conduit 116 to accumulator 106.

Compressor 122 may raise the pressure of the primary fluid. The increase in pressure in the primary fluid may be used to provide the workflow required to circulate the primary fluid within primary fluid flow path 111 and VCS loop 109. Raising the pressure of the primary fluid may also raise the temperature of the primary fluid, thereby allowing heat to be rejected from the primary fluid to the ambient environment in VCS condenser 124. In some examples, compressor 122 may be a device configured to raise the pressure of vapor-phase primary fluid.

TES medium may be received at the second TES evaporator inlet of TES evaporator 160 from warm-temperature liquid pump 198, and subsequently flow through hot-side channels of TES evaporator 160. As a result, TES evaporator 160 rejects heat in the TES medium to the primary fluid in the cold-side channels of TES evaporator 160. TES medium flowing out of TES evaporator 160 through the second TES evaporator outlet may flow through TES-evaporator-cold-tank conduit 172 to cold-temperature tank 170. Primary fluid flowing out of TES evaporator 160 may flow through TES-evaporator conduit 152 and compressor-inlet conduit 134 to compressor 122.

Fluid may be received at the second secondary evaporator inlet from secondary thermal load 166 in secondary load cooling loop 168 and may flow through hot-side channels of secondary evaporator 164, and may thereby reject heat in the fluid to the primary fluid in the cold-side channels of secondary evaporator 164. Fluid flowing out of secondary evaporator 164 through the second secondary evaporator outlet may flow through secondary load cooling loop 168 to secondary thermal load 166. Primary fluid flowing out of secondary evaporator 164 may flow through secondary-evaporator conduit 156, TES-evaporator conduit 152, and compressor-inlet conduit 134 to compressor 122. Consequently, heat transferred from secondary thermal load 166 to secondary evaporator 164 may be transferred to VCS loop 109, specifically VCS condenser 124, and to the ambient environment.

Cold-temperature liquid pump 178 and warm-temperature liquid pump 198 may raise the pressure of TES medium and may provide workflow to move TES medium downstream within TES loop 113.

During operation of the thermal management system 100, the temperature difference between the TES medium in cold-temperature tank 170 and warm-temperature tank 194 may be maintained to be at least a predetermined temperature difference. The predetermined temperature difference may be maintained by controlling delivery of the primary fluid through thermal expansion valve 154 to first TES evaporator 160, which may transfer heat from the TES medium to the primary fluid. Alternatively, or in addition, the predetermined temperature difference may be maintained by controlling flow rate through warm-temperature liquid pump 198. The predetermined temperature difference is selected such that the TES medium in cold-temperature tank 170 is colder than in warm-temperature tank 194. Examples of the predetermined temperature difference may be 5, 10, 15, 20, 30, 40, 60, 80, 100, 120, 140, 160, 180, or 200 degrees Celsius. Alternatively, the predetermined temperature difference may be any other temperature difference in other examples. The actual temperature difference between the TES medium in cold-temperature tank 170 and warm-temperature tank 194 may vary during operation of thermal management system 100 as thermal management system 100 maintains at least the predetermined temperature difference. Further, the predetermined temperature difference may itself vary during operation of thermal management system 100. The predetermined temperature difference may be a function of one or more system parameters such as temperature of TES medium in warm-temperature tank 194 and/or temperature of the primary fluid in TPP loop 105, among other parameters.

TES medium may include, but not be limited to, a mixture of water with any fluid that is soluble, dispersible, or miscible with the water. Several examples of such a fluid or fluid mixture, include, but are not limited to, water, ethylene glycol, propylene glycol, glycerol, alcohol, or mixtures thereof, such as water-ethylene glycol ("EGW"), water-propylene glycol ("PGW"), water-glycerol, and water-alcohol. The water solution could also include encapsulated phase change material, in order to increase the thermal storage capability of the water solution. Alternatively, the fluid or fluid mixture includes vehicle fuel. The TES medium is in liquid phase during operation of the examples of thermal management systems of the present disclosure, with the exception of the small encapsulated phase change material, if so included in the TES medium.

It is desirable that TES medium in cold-temperature tank 170 may be maintained at a cold temperature and warm-temperature TES medium not be mixed back into cold-temperature tank 170. Instead, it is desirable that warm-temperature TES medium is collected in warm-temperature tank 194 for storage. The warm-temperature TES medium may then be chilled and returned to cold-temperature tank 170 at the desired cold-temperature operating condition of cold-temperature tank 170. Cold-temperature TES medium may include, for example, TES medium flowing downstream of first TES evaporator 160 and upstream of mix valve 174. Warm-temperature TES medium may include, for example, TES medium flowing downstream of TPPL condenser 104 and upstream of first TES evaporator 160 and TES medium in junction-mix-valve conduit 188.

So as to advantageously limit TES size and weight, the temperature of TES medium in cold-temperature tank 170 may advantageously be as low as possible or at least lowered to some extent. Further, the temperature of TES medium in warm-temperature tank 194 may advantageously be as high as possible or at least increased to some extent. Accordingly, the difference in temperature between TES medium in cold-temperature tank 170 and TES medium in warm-temperature tank 194 may advantageously be as high as possible or at least increased. By maximizing or even merely increasing the temperature difference between TES medium in warm-temperature tank 194 and TES medium in cold-temperature tank 170, the amount of TES medium required to absorb the heat may be limited. Additionally, a larger temperature difference between cold-temperature TES medium and warm-temperature TES medium may provide a larger temperature difference across heat exchangers, which may enable smaller heat exchangers and reduced TES flow-rate. Smaller heat exchangers and reduced flow rate may result in reduced system power consumption and reduced system mass and volume relative to a TES loop that includes a single tank with TES medium that begins at the same minimum cold temperature as the TES medium in cold-temperature tank 170 as described herein, but that increases in temperature as heat is absorbed into the single TES tank.

By including both cold-temperature tank 170 and warm-temperature tank 194, cold-temperature tank 170 and warm-temperature tank 194 may be operated at or near atmospheric pressure. The relatively low flow rate of the cold-temperature TES medium from cold-temperature tank 170 may advantageously result in only minor losses of pressure in mix valve 174. Tanks at atmospheric pressure may advantageously enable more light-weight tanks. Further, tanks at atmospheric pressure may be shaped as rectangular prisms or cuboid, which may advantageously enable the use of more efficient thermal insulation that may require less volume and/or enable better packing efficiency of the tanks. The respective flow rates of the TES medium into and out of warm-temperature tank 194 and cold-temperature tank 170 may not be equal. To advantageously minimize pressure differences between warm-temperature tank 194 and cold-temperature tank 170 and minimize venting to the ambient environment, a line (not shown) may connect the air and/or vapor portion of warm-temperature tank 194 and cold-temperature tank 170.

During operation, the primary fluid, the TES medium, and the fluid in secondary load cooling loop 168 may transfer heat from primary thermal load 102 and secondary thermal load 166 to the ambient environment. When thermal management system 100 is fully "charged," cold-temperature tank 170 may be filled with cold-temperature TES medium. When primary thermal load 102 requires cooling, cold-temperature TES medium may be pumped to TPPL condenser 104 to condense a portion of vapor-phase primary fluid that is coming from primary thermal load 102 in TPP loop 105. Vapor-phase primary fluid that is not condensed in TPPL condenser 104 flows to accumulator 106 and then to VCS loop 109. The vapor-phase primary fluid flows to compressor 122. Mix valve 174 may control the temperature of TES medium that flows to TPPL condenser 104 to condense an appropriate amount of vapor-phase primary fluid, by advantageously mixing effluent TES medium from TPPL condenser 104 through junction-mix-valve conduit 188 with cold-temperature TES medium from cold-temperature tank 170 that returns to TPPL condenser 104. To minimize the weight and volume of TES loop 113 required, thermal management system 100 may reject as much heat as possible to the ambient environment through VCS condenser 124 when primary thermal load 102 is a high transient load.

It may be advantageous to not oversize the components of VCS loop 109, and especially advantageous not to oversize VCS condenser 124, because condensers may get very large and consume a lot of power to run fans, such as fan 126, on very hot days. The components of VCS loop 109 may be made significantly smaller by the advantageous addition of TES loop 113.

As TES medium absorbs heat from TPPL condenser 104, heated TES medium flows to warm-temperature tank 194. When primary thermal load 102 is a high transient load, the saturation suction temperature ("SST") of compressor 122 may be maintained just sufficiently low enough so as to be able to provide adequate cooling to secondary thermal load 166. In this condition, the TES medium may not be cooled in TES evaporator 160. Any additional cooling capacity in VCS loop 109 would be used to condense vapor that is passed through second-accumulator-outlet conduit 130. In this way, the VCS loop 109 will have an overall higher cooling capacity than if the SST were held to a lower temperature for chilling the TES medium.

As primary thermal load 102 is reduced, the SST may be lowered to be able to chill TES medium in warm-temperature tank 194. When primary thermal load 102 is low, the flow rate of TES medium from warm-temperature tank 194 to TES evaporator 160 may be maintained to be able to deliver TES medium to cold-temperature tank 170 at a targeted cold-temperature tank 170 temperature. Expansion valve 158 may provide required primary fluid flow to cool secondary thermal load 166 while maintaining a target superheat temperature at the first secondary evaporator outlet. Further, expansion valve 154 may provide primary fluid flow to TES evaporator 160 so as to provide optimized cooling of TES medium while maintaining a target superheat temperature at first TES evaporator outlet. Examples of expansion valve 154 may include a thermal expansion valve or an electronic expansion valve.

The temperature of TES medium in cold-temperature tank 170 may be lowered only to a temperature slightly higher than the SST of compressor 122. Further, the temperature of TES medium in warm-temperature tank 194 may be raised only to a temperature slightly lower than the saturation temperature of the primary fluid in TPPL condenser 104.

Figure 2:
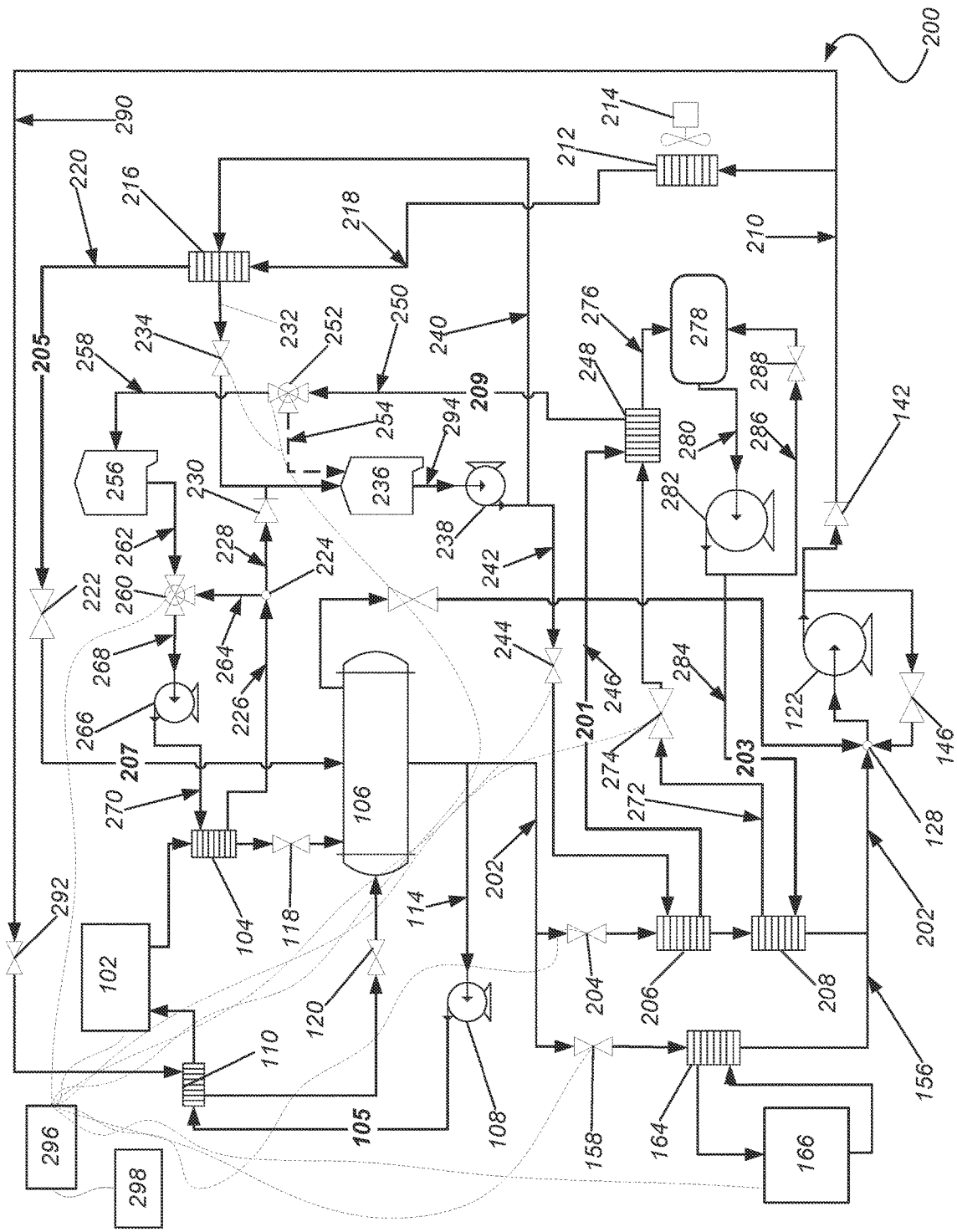
FIG. 2 illustrates a schematic of another example of a thermal management system according to the principles of the present disclosure.

FIG. 2 illustrates a schematic of another example of a thermal management system 200 according to the principles of the present disclosure. Thermal management system 200 includes many of the same components performing the same functions as those described herein elsewhere. Primary differences between thermal management system 100 illustrated in FIG. 1 and thermal management system 200 illustrated in FIG. 2 are: the conduits between TPP loop 105 and the VCS loops include additional components in thermal management system 200 of FIG. 2; TES loop 201 includes additional components; instead of VCS loop 109, low-temperature VCS loop 203 is thermally coupled to TES loop 201 and primary fluid flow path 207; and high-temperature VCS loop 205 in primary fluid flow path 207 is thermally coupled to TES loop 201. Low-temperature VCS loop 203 may also be referred to as a "second VCS loop."

Primary fluid flow path 207, and more specifically, high-temperature VCS loop 205 illustrated in FIG. 2, may include a compressor-high-temperature-VCS-condenser conduit 210 in fluid communication with, and/or coupled to, the compressor outlet. High-temperature VCS condenser 212 may include a high-temperature VCS condenser inlet and a high-temperature VCS condenser outlet. High-temperature VCS condenser inlet is in fluid communication with, and/or coupled to, compressor-high-temperature-VCS-condenser conduit 210. High-temperature VCS condenser outlet is in fluid communication with, and/or coupled to, high-temperature-VCS-TES-condenser-VCS-condenser conduit 218. High-temperature VCS-TES condenser 216 may include a first high-temperature VCS-TES condenser inlet, a first high-temperature VCS-TES condenser outlet, a second high-temperature VCS-TES condenser inlet, and a second high-temperature VCS-TES condenser outlet. High-temperature VCS-TES condenser 216 may also be referred to as a "VCS-TES condenser." First high-temperature VCS-TES condenser inlet may be in fluid communication with, and/or coupled to, VCS-condenser-high-temperature-VCS-TES-condenser conduit 218. Each of first high-temperature VCS-TES condenser outlet and second accumulator inlet may be in fluid communication with, and/or coupled to, VCS-TES-condenser-accumulator conduit 220. Accordingly, high-temperature VCS loop 205 may be arranged such that each subsequent component of accumulator 106, compressor 122, high-temperature VCS condenser 212, and high-temperature VCS-TES condenser 216 may be located downstream of the prior components, and the effluent of high-temperature VCS-TES condenser 216 ultimately being returned to second accumulator inlet after flowing around high-temperature VCS loop 205.

Primary fluid flow path 207 may include one or more conduits between TPP loop 105 and high-temperature VCS loop 205. For example, evaporator-condenser conduit 202 may be in fluid communication with, and/or coupled to, each of accumulator-TPPL-liquid-pump conduit 114 upstream of TPPL liquid pump 108, and conduit junction 128. High-temperature TES evaporator 206 may include first high-temperature TES evaporator inlet, first high-temperature TES evaporator outlet, second high-temperature evaporator outlet, and second high-temperature evaporator outlet. Low-temperature VCS condenser 208 may include first low-temperature VCS condenser inlet, first low-temperature VCS condenser outlet, second low-temperature VCS condenser inlet, and second low-temperature VCS condenser outlet. Low-temperature VCS condenser 208 may also be referred to as a "second VCS condenser." In some examples (and as shown in FIG. 2), evaporator-condenser conduit 202 may include high-temperature TES evaporator 206 and low-temperature VCS condenser 208 disposed, sequentially, in series, on evaporator-condenser conduit 202, also referred to as "first-TES-evaporator conduit," such that, sequentially, upstream to downstream, each of first high-temperature TES evaporator inlet, first high-temperature TES evaporator outlet, first low-temperature VCS condenser inlet, and first low-temperature VCS condenser outlet, are in fluid communication with, and/or coupled to, evaporator-condenser conduit 202, and first-high-temperature TES evaporator outlet and first low-temperature VCS condenser inlet are in fluid communication with, and/or coupled to, one another via evaporator-condenser conduit 202. In other examples (not shown in FIG. 2), evaporator-condenser conduit 202 may include low-temperature VCS condenser 208 and high-temperature TES evaporator 206 disposed, sequentially, in series, on evaporator-condenser conduit 202, also referred to as "first-TES-evaporator conduit," such that, sequentially, upstream to downstream, each of first low-temperature VCS condenser inlet, first low-temperature VCS condenser outlet, first high-temperature TES evaporator inlet, and first high-temperature TES evaporator outlet, are in fluid communication with, and/or coupled to, evaporator-condenser conduit 202, and first low-temperature VCS condenser outlet and first high-temperature TES evaporator inlet are in fluid communication with, and/or coupled to, one another via evaporator-condenser conduit 202. Heat may be transferred from high-temperature TES evaporator 206 and low-temperature VCS condenser 208 to high-temperature VCS loop 205, high-temperature VCS condenser 212, and the ambient environment.

Further, secondary-evaporator conduit 156 may be in fluid communication with, and/or coupled to, evaporator-condenser conduit 202 upstream of the sequentially first of high-temperature TES evaporator 206 and low-temperature VCS condenser 208, and in fluid communication with, and/or coupled to, evaporator-condenser conduit 202 downstream of the sequentially second of high-temperature TES evaporator 206 and low-temperature VCS condenser 208. Secondary evaporator 164 is disposed on secondary-evaporator conduit 156 in parallel to both of high-temperature TES evaporator 206 and low-temperature VCS condenser 208. Heat may be thereby transferred from secondary thermal load 166 to high-temperature VCS loop 205, high-temperature VCS condenser 212, and the ambient environment.

Further, primary fluid flow path 207 may include high-temperature-VCS-loop-preheater conduit 290, which may be in fluid communication with, and/or coupled to, each of compressor-high-temperature-VCS-condenser conduit 210 upstream of high-temperature VCS condenser 212 and the second preheater inlet.

TES loop 201, as shown in FIG. 2, may be in fluid communication with, and/or coupled to, each of the second TPPL condenser inlet, the second TPPL condenser outlet, the second high-temperature TES evaporator inlet, and the second high-temperature TES evaporator outlet. Accordingly, TES loop 201 is thermally coupled to primary fluid flow path 207 by each of TPPL condenser 104 and high-temperature TES evaporator 206. TES loop 201 is configured to transfer heat from TPP loop 105, to the TES medium, and then at a later time to transfer heat from the TES medium, to high-temperature VCS loop 205. TES loop 201 may include a TES medium flow path 209 and various components configured to transfer heat from one location and dispose of, or reject, the heat into another location. For example, various components of TES loop 201 may include TPPL condenser 104, warm-temperature tank 236, warm-temperature liquid pump 238, high-temperature TES evaporator 206, low-temperature TES evaporator 248, three-way valve 252, cold-temperature tank 256, mix valve 260, and cold-temperature liquid pump 266. Warm-temperature tank 236 may also be referred to as a "first tank." Warm-temperature liquid pump 238 may also be referred to as a "first liquid pump." Low-temperature TES evaporator 248 may also be referred to as a "second TES evaporator." Cold-temperature tank 256 may also be referred to as a "second tank." Cold-temperature liquid pump 266 may also be referred to as a "second liquid pump." TES loop 201 may be arranged such that each subsequent component, as listed in the order above, may be located downstream of the prior components, and the effluent of cold-temperature liquid pump 266 ultimately being returned to second TPPL condenser inlet after flowing around TES loop 201. Warm-temperature tank 236 may include a warm-temperature tank inlet, a second warm-temperature tank inlet, and a warm-temperature tank outlet. Warm-temperature liquid pump 238 may include a warm-temperature liquid pump inlet and a warm-temperature liquid pump outlet. Low-temperature TES evaporator 248 may include a first low-temperature TES evaporator inlet, a first low-temperature TES evaporator outlet, a second low-temperature TES evaporator inlet, and a second low-temperature TES evaporator outlet. Cold-temperature tank 256 may include a cold-temperature tank inlet and a cold-temperature tank outlet. Cold-temperature liquid pump 266 may include a cold-temperature liquid pump inlet and a cold-temperature liquid pump outlet. TES loop 201 may further include high-temperature VCS-TES condenser 216.

Each of the above components forming TES loop 201 may be in fluid communication with, and/or coupled to, one another via one or more conduits. Second TPPL condenser outlet may be in fluid communication with, and/or coupled to, warm-temperature tank 236, by second-TPPL-condenser-outlet conduit 226 and warm-temperature-tank-inlet conduit 228. Conduit junction 224 may be disposed between second-TPPL-condenser-outlet conduit 226 and warm-temperature-tank-inlet conduit 228 such the conduit junction 224 is in fluid communication with, and/or coupled to, each of second-TPPL-condenser-outlet conduit 226 and warm-temperature-tank-inlet conduit 228. Warm-temperature tank outlet may be in fluid communication with, and/or coupled to, warm-temperature liquid pump inlet by warm-tank-liquid-pump conduit 294. Warm-temperature liquid pump outlet may be in fluid communication with, and/or coupled to, second high-temperature TES evaporator inlet by liquid-pump-TES-evaporator conduit 242. Second high-temperature TES evaporator outlet may be coupled to first low-temperature TES evaporator inlet by evaporator-evaporator conduit 246. Three-way valve 252 may be in fluid communication with, and/or coupled to, first low-temperature TES evaporator outlet by low-temperature-TES-evaporator-outlet conduit 250, and in fluid communication with, and/or coupled to, cold-temperature tank inlet by cold-temperature-tank-inlet conduit 258. Three-way valve 252 may further be in fluid communication with, and/or coupled to, second warm-temperature tank inlet by three-way-valve-warm-tank conduit 254. Mix valve 260 may be in fluid communication with, and/or coupled to, cold-temperature tank outlet by cold-temperature-tank-outlet conduit 262, in fluid communication with, and/or coupled to, cold-temperature liquid pump inlet by mix-valve-liquid-pump conduit 268, and in fluid communication with, and/or coupled to, conduit junction 224 by junction-mix-valve conduit 264. Cold-temperature liquid pump 266 may be in fluid communication with, and/or coupled to, second TPPL condenser inlet by liquid-pump-TPPL-condenser conduit 270.

TES loop 201 may further include second-high-temperature-VCS-TES-condenser-inlet conduit 240, which may be in fluid communication with, and/or coupled to, each of liquid-pump-TES-evaporator conduit 242 and second high-temperature VCS-TES condenser inlet. TES loop 201 may further include second-high-temperature-VCS-TES-condenser-outlet conduit 232, which may be in fluid communication with, and/or coupled to, each of second high-temperature VCS-TES condenser outlet and warm-temperature-tank-inlet conduit 228.

Thermal management system 200 may further include low-temperature VCS loop 203 in a cascaded architecture with, and thermally coupled to, TES loop 201 by low-temperature TES evaporator 248, and thermally coupled to primary fluid flow path 207 by low-temperature VCS condenser 208, such that low-temperature VCS loop 203 may reject heat from TES loop 201 to primary fluid flow path 207, which then may reject heat to the ambient environment in high-temperature VCS loop 205. Low-temperature VCS loop 203, or "second VCS loop," may include a low-temperature VCS fluid, or a "second VCS fluid," disposed in low-temperature VCS loop 203 and a second VCS fluid flow path. Low-temperature VCS loop 203 may include low-temperature VCS condenser 208, low-temperature TES evaporator 248, low-temperature VCS accumulator 278, and low-temperature VCS compressor 282. Low-temperature VCS condenser 208 may also be referred to as a "second VCS condenser." Low-temperature TES evaporator 248 may also be referred to as a "second TES evaporator." Low temperature VCS accumulator 278 may also be referred to as a "VCS accumulator." Low-temperature VCS compressor 282 may also be referred to as a "VCS compressor." Low-temperature VCS loop 203 may be arranged such that each subsequent component, as listed in the order above, may be located downstream of the prior components, and the effluent of low-temperature VCS compressor 282 ultimately being returned to second low-temperature VCS condenser inlet after flowing around low-temperature VCS loop 203. Low-temperature VCS accumulator 278 may include a first low-temperature VCS accumulator inlet, a second low-temperature VCS accumulator inlet, and a low-temperature VCS accumulator outlet, and may be alternatively located in different positions around low-temperature VCS loop 203.

Low-temperature VCS compressor 282 may include a low-temperature VCS compressor inlet and a low-temperature VCS-compressor outlet.

Second low-temperature VCS condenser outlet may be in fluid communication with, and/or coupled to, second low-temperature TES evaporator inlet by low-temperature-VCS-condenser-TES-evaporator conduit 272. Second low-temperature TES evaporator outlet may be in fluid communication with, and/or coupled to, the first low-temperature VCS accumulator inlet by low-temperature-TES-evaporator-VCS accumulator conduit 276. Low-temperature VCS accumulator outlet may in fluid communication with, and/or coupled to, low-temperature VCS compressor inlet by low-temperature-VCS-accumulator-compressor conduit 280. Low-temperature VCS compressor outlet may be in fluid communication with, and/or coupled to, second low-temperature VCS condenser inlet by low-temperature-VCS-compressor-condenser conduit 284. Low-temperature VCS loop 203 may further include low-temperature-vapor-return conduit 286, which may be in fluid communication with, and/or coupled to, each of low-temperature-VCS-compressor-condenser conduit 284 and second low-temperature VCS accumulator inlet.

Low-temperature VCS fluid may be any substance suitable for use in low-temperature VCS loop 203. In other words, low-temperature VCS fluid may be any substance suitable for a trans-critical cooling system and/or a sub-critical cooling system. Examples of a low-temperature VCS fluid may include, without limitation, carbon dioxide ($CO_2$), anhydrous ammonia, a halomethane, a haloalkane, a hydrofluorocarbon ("HFC"), a chlorofluorocarbon ("CFC"), a hydrochlorofluorocarbon ("HCFC"), any two-phase fluids, and/or a nanofluid. In some examples, low-temperature VCS fluid may include R410a, or R407C.

Primary fluid flow path 207 may include one or more valves disposed within the conduits of primary fluid flow path 207 at preferable locations. For example, VCS-TES-condenser-accumulator conduit 220 may have expansion valve 222 disposed thereon. Examples of expansion valve 222 may include a thermal expansion valve, an electronic expansion valve, or a back-pressure regulator. Further, evaporator-condenser conduit 202 may include expansion valve 204 disposed thereon, upstream of the sequentially first of high-temperature TES evaporator 206 and low-temperature VCS condenser 208 and downstream of entrance to secondary-evaporator conduit 156. Examples of expansion valve 204 may include a thermal expansion valve, an electronic expansion valve, or a back-pressure regulator. Further, high-temperature-VCS-loop-preheater conduit 290 may include modulating valve 292 disposed thereon.

TES loop 201 may include one or more valves disposed within the conduits of TES loop 201 at preferable locations. For example, warm-temperature-tank-inlet conduit 228 may include valve 230 disposed thereon, upstream of second-high-temperature-VCS-TES-condenser-outlet conduit 232. Valve 230 may be a passive check valve with a cracking pressure. Further, second-high-temperature-VCS-TES-condenser-outlet conduit 232 may include modulating valve 234 disposed thereon, upstream of warm-temperature-tank-inlet conduit 228. Further, liquid-pump-TES-evaporator conduit 242 may include modulating valve 244 disposed thereon, downstream of second-high-temperature-VCS-TES-condenser-inlet conduit 240.

Low-temperature VCS loop 203 may include one or more valves disposed within the conduits of low-temperature VCS loop 203 at preferable locations. For example, low-temperature-VCS-condenser-TES-evaporator conduit 272 may include expansion valve 274. Examples of expansion valve 274 may include a thermal expansion valve or an electronic expansion valve. Further, low-temperature-vapor-return conduit 286 may include modulating valve 288.

Each of modulating valve 234, modulating valve 244, modulating valve 288, and modulating valve 292 may be a flow control valve. Modulating valve 292 may be open, partially open, or closed so as to advantageously adjust flow of primary fluid on primary fluid flow path 207. Each of modulating valve 234 and modulating valve 244 may independently and separately be open, partially open, or closed so as to advantageously adjust flow of TES medium on TES loop 201. Modulating valve 288 may be open, partially open, or closed so as to advantageously adjust fluid flow of low-temperature VCS fluid on low-temperature VCS loop 203.

High-temperature VCS condenser 212 may receive the higher-temperature/pressure primary fluid from compressor 122. High-temperature VCS condenser 212 may be a heat exchanger that rejects heat from the primary fluid to a heat sink, which may be, for example, the ambient environment. Examples of high-temperature VCS condenser 212 may include a parallel-flow, counter-flow, multi-pass-flow, and cross-flow heat exchanger. The primary fluid may run in hot-side channels of high-temperature VCS condenser 212. Cold-side channels of high-temperature VCS condenser 212 may be filled with a fluid from a heat sink, for example, ambient air. High-temperature VCS condenser 212 may include a force ventilation unit, such as fan 214, which may increase the flow rate of the heat sink over high-temperature VCS condenser 212. The "sizing" of high-temperature VCS condenser 212 may factor in the addition of the forced ventilation unit, such as fan 214. Examples of high-temperature VCS condenser 212 may also include pumps for rejecting heat, for example, to water.

High-temperature VCS-TES condenser 216 may also be referred to as a "VCS-TES condenser" and may receive the primary fluid from high-temperature VCS condenser 212 and TES medium from second-high-temperature-VCS-TES-condenser-inlet conduit 240. High-temperature VCS-TES condenser 216 may be a heat exchanger that rejects heat from the primary fluid to a heat sink, which may be, for example, TES medium. Examples of high-temperature VCS-TES condenser 216 may include a parallel-flow, counter-flow, multi-pass-flow, and cross-flow heat exchanger. The primary fluid may run in hot-side channels of high-temperature VCS-TES condenser 216. Cold-side channels of high-temperature VCS-TES condenser 216 may be filled with a fluid from a heat sink, for example, TES medium.

Low-temperature VCS condenser 208 may receive the primary fluid through evaporator-condenser conduit 202, and may receive the low-temperature VCS coolant from low-temperature VCS compressor 282. Low-temperature VCS condenser 208 may be a heat exchanger that rejects heat from the low-temperature VCS fluid to a heat sink, which may be, for example, the primary fluid. Examples of low-temperature VCS condenser 208 may include a parallel-flow, counter-flow, multi-pass-flow, and cross-flow heat exchanger. The primary fluid may run in cold-side channels of low-temperature VCS condenser 208. Hot-side channels of low-temperature VCS condenser 208 may be filled with a fluid from a heat source, for example, the low-temperature VCS fluid.

Primary fluid may be received at the first high-temperature TES evaporator inlet through evaporator-condenser conduit 202. TES medium may be received at the second high-temperature TES evaporator inlet from warm-temperature liquid pump 238, may flow through hot-side channels of high-temperature TES evaporator 206, and may thereby reject heat in the TES medium to primary fluid in the cold-side channels of high-temperature TES evaporator 206. TES medium flowing out of high-temperature TES evaporator 206 through second high-temperature TES evaporator outlet may flow through evaporator-evaporator conduit 246 to low-temperature TES evaporator 248. Primary fluid flowing out of high-temperature TES evaporator 206 may flow through evaporator-condenser conduit 202 toward compressor 122.

TES medium may be received at the first low-temperature TES evaporator inlet through evaporator-evaporator conduit 246. Low-temperature VCS fluid may be received at the second low-temperature TES evaporator inlet from low-temperature VCS condenser 208, may flow through cold-side channels of low-temperature TES evaporator 248, and may thereby reject heat in the TES medium in the hot-side channels of low-temperature TES evaporator 248 to low-temperature VCS fluid. Low-temperature VCS fluid flowing out of low-temperature TES evaporator 248 through second low-temperature TES evaporator outlet may flow through low-temperature-TES-evaporator-VCS accumulator conduit 276 to low-temperature VCS accumulator 278. TES medium flowing out of low-temperature TES evaporator 248 may flow through low-temperature-TES-evaporator-outlet conduit 250 to three-way valve 252 and to cold-temperature tank 256.

Low-temperature VCS compressor 282 may raise the pressure of the low-temperature VCS fluid. The increase in pressure in the low-temperature VCS fluid may be used to provide the workflow required to circulate the low-temperature VCS fluid within low-temperature VCS loop 203. Raising the pressure of the low-temperature VCS fluid may also raise the temperature of the low-temperature VCS fluid, thereby allowing heat previously absorbed from the TES medium to be rejected from the low-temperature VCS fluid to the primary fluid and, subsequently, the ambient environment in high-temperature VCS condenser 212.

Cold-temperature liquid pump 266 and warm-temperature liquid pump 238 may raise the pressure of TES medium and may provide workflow to move TES medium downstream within TES loop 201.

During operation of thermal management system 200, the TPPL 105, high-temperature VCS loop 205, TES loop 201, and low-temperature VCS loop 203 may maintain the temperature difference between TES medium in cold-temperature tank 256 and warm-temperature tank 236 to be at least a predetermined temperature difference. The predetermined temperature difference may be maintained by controlling delivery of the primary fluid through thermal expansion valve 204 to first TES evaporator 206, which may transfer heat from the TES medium to the primary fluid. Alternatively, or in addition, the predetermined temperature difference may be maintained by controlling flow of the TES medium through modulating valve 244 to first TES evaporator 206, which may transfer heat to the primary fluid. Alternatively, or in addition, the predetermined temperature difference may be maintained by controlling flow of the TES medium through three-way valve 252 to cold-temperature tank 256 and/or warm-temperature tank 236. Alternatively, or in addition, the predetermined temperature difference may be maintained by controlling flow of the low-temperature VCS fluid through thermal expansion valve 274, thereby controlling transfer of heat from the TES medium to the low-temperature VCS fluid across second TES evaporator 248 and transfer of heat from the low-temperature VCS fluid to the primary fluid across second VCS condenser 208. Alternatively, or in addition, the predetermined temperature difference may be maintained by controlling flow of the TES medium through modulating valve 234 from VCS-TES condenser 216 to warm-temperature tank 236. When primary thermal load 102 is a high transient heat load, warm-temperature TES medium entering warm-temperature tank 236 may flow to high-temperature VCS-TES condenser 216 to absorb more heat from the primary fluid. By increasing heat transfer from primary fluid to TES medium in high-temperature VCS-TES condenser 216, compressor 122 may advantageously operate at a lower saturation discharge temperature ("SDT"), which may in turn advantageously provide for compressor 122 to operate at a higher efficiency and/or higher flow rate and therefore require less TES medium from cold-temperature tank 256 to support cooling of primary thermal load 102 via TPPL condenser 104. The predetermined temperature difference is selected such that the TES medium in cold-temperature tank 256 is colder than in warm-temperature tank 236. Examples of the predetermined temperature difference may be 5, 10, 15, 20, 30, 40, 60, 80, 100, 120, 140, 160, 180, or 200 degrees Celsius. Alternatively, the predetermined temperature difference may be any other temperature difference in other examples. The actual temperature difference between the TES medium in cold-temperature tank 256 and warm-temperature tank 236 may vary during operation of thermal management system 200 as thermal management system 200 maintains at least the predetermined temperature difference. Further, the predetermined temperature difference may itself vary during operation of thermal management system 200. The predetermined temperature difference may be a function of one or more system parameters such as temperature of TES medium in warm-temperature tank 236 and/or temperature of the primary fluid in TPP loop 105, among other parameters.

It is desirable that TES medium in cold-temperature tank 256 may be maintained at a cold temperature and warm-temperature TES medium not be mixed back into cold-temperature tank 256. Instead, it is desirable that warm-temperature TES medium is collected in warm-temperature tank 236 for storage. The warm-temperature TES medium may then be chilled and returned to cold-temperature tank 256 at the desired cold-temperature operating condition of cold-temperature tank 256.

So as to advantageously limit TES size and weight, the temperature of TES medium in cold-temperature tank 256 may advantageously be as low as possible or at least lowered to some extent. Further, the temperature of TES medium in warm-temperature tank 236 may advantageously be as high as possible or at least increased to some extent. Accordingly, the difference in temperature between TES medium in cold-temperature tank 256 and TES medium in warm-temperature tank 236 may advantageously be as high as possible or at least increased. By maximizing or even merely increasing the temperature difference between TES medium in warm-temperature tank 236 and TES medium in cold-temperature tank 256, the amount of TES medium required to absorb the heat may be limited. Additionally, a larger temperature difference between cold-temperature TES medium and warm-temperature TES medium may provide a larger temperature difference across heat exchangers, which may enable smaller heat exchangers and lower flow rates. Smaller heat exchangers and lower flow rates may result in reduced system power consumption and reduced system mass and volume relative to a TES loop that includes a single tank with TES medium starting at the same minimum initial cold temperature but that increases in temperature as heat is added.

Further, high-temperature VCS condenser 212 may be made smaller, and may require less support from a force ventilation unit, such as fan 214 if more heat is transferred in high-temperature VCS-TES condenser 216. High-temperature VCS-TES condenser 216 provides a liquid-phase heat sink in TES medium, thereby advantageously reducing overall system size significantly. More heat is advantageously stored in warm-temperature tank 236 during the high transient load, and advantageously transferred to low-temperature VCS loop 203, high-temperature VCS loop 205, and ultimately, the ambient environment when the high transient load has been reduced or eliminated. High-temperature VCS-TES condenser 216 may not require additional TES medium, but may advantageously take advantage of TES medium already accumulated in warm-temperature tank 236 from TPPL condenser 104.

When the ambient heat sink temperature falls, low-temperature VCS loop 203 and high temperature VCS loop 205 may have increased cooling capacity. Advantageously, low-temperature VCS compressor 282 may be turned off at a predetermined set point, and only high-temperature VCS loop 205, including compressor 122, be used to reject heat to the ambient environment. Further, less condensing in TPPL condenser 104 may be necessary to reject heat as the cooling capacity of high-temperature VCS loop 205 increases, and TES medium in cold-temperature tank 256 would not be needed to be cooled to a temperature as low as when the ambient heat sink temperatures are high. When cooling capacity of high-temperature VCS loop 205 is sufficiently high, and ambient heat sink temperature is sufficiently low, no condensing may need to be performed by TPPL condenser 104, in which case three-way valve 252 may route or divert or may be configured to route or divert TES medium to warm-temperature tank 236 via three-way-valve-warm-tank conduit 254 instead of cold-temperature tank 256, and cold-temperature liquid pump 266 may be turned off. Finally, in extremely low temperature ambient conditions, sufficient VCS cooling capacity may exist, that the TES medium is not needed to support the cooling of the primary and secondary loads.

Thermal management system 200 may further include processor 296, which may be in communication with memory 298. In the example of a thermal management system 200 illustrated in FIG. 2, processor 296 is configured to control modulating valve 120, modulating valve 146, thermal expansion valve 158, thermal expansion valve 204, thermal expansion valve 274, modulating valve 244, mix valve 260, three-way valve 252, modulating valve 288, modulating valve 292, and/or modulating valve 234 to advantageously adjust flow of the primary fluid and/or the TES medium and/or the VCS fluid, as well as speed of compressor 122, low-temperature VCS compressor 282, cold-temperature liquid pump 266, warm-temperature liquid pump 238, TPPL liquid pump 108, and/or fan 214 as primary thermal load 102 and/or secondary thermal load 166 vary or ambient conditions vary.

Figure 3:
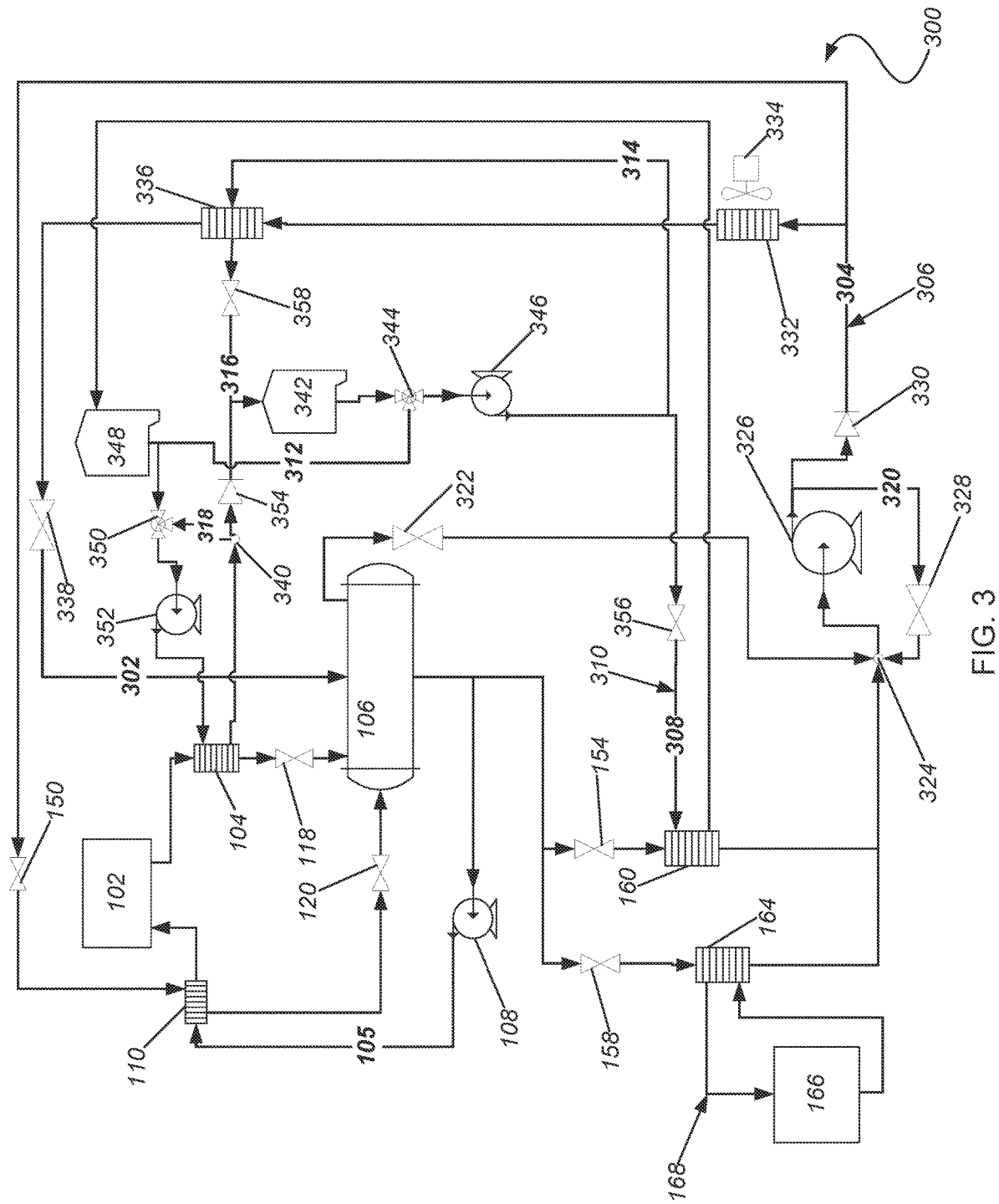
FIG. 3 illustrates a schematic of yet another example of a thermal management system according to the principles of the present disclosure.

FIG. 3 illustrates a schematic of yet another example of a thermal management system 300 to cool a transient heat load, for example, primary thermal load 102, and a steady-state load, for example, secondary thermal load 166. Thermal management system 300 includes primary fluid flow path 302 that includes one or more loops that are in fluid communication with one another. In the illustrated example, primary fluid flow path 302 includes a primary fluid disposed in primary fluid flow path 302 that may include, at varying locations in primary fluid flow path 302, a liquid-phase primary fluid, a vapor-phase primary fluid, or a mixture of liquid- and vapor-phase primary fluid. The primary fluid may advantageously absorb heat from primary thermal load 102 through the latent heat of vaporization. Thermal management system 300 further includes thermal energy storage ("TES") loop 310 that is thermally coupled to primary fluid flow path 302. TES loop 310 includes a TES medium disposed in TES loop 310 that may absorb heat from one or more loops of primary fluid flow path 302 and may transfer, or reject, heat to another loop of primary fluid flow path 302. TES loop 310 may further include TES medium flow path 308. Thermal management system 300 further includes a secondary load cooling loop 168. Secondary load cooling loop 168 includes secondary thermal load 166 disposed thereon. Secondary load cooling loop 168 further includes a secondary fluid disposed thereon. Each of primary fluid flow path 302 (including each loop of primary fluid flow path 302), TES loop 310, TES medium flow path 308, and secondary load cooling loop 168 may include various components configured to transfer heat from one location and dispose of, or reject, the heat into another location.

For example, one loop of primary fluid flow path 302 is vapor compression system ("VCS") loop 304, which may be additionally referred to as a "first VCS loop." Various components of VCS loop 304 of primary fluid flow path 302, or the "VCS vapor-phase primary fluid flow path," may include accumulator 106, compressor 326, VCS condenser 332, and VCS-TES condenser 336. VCS loop 304 may be arranged such that each subsequent component, as listed in the order above, may be located downstream of the prior components, and the effluent of VCS-TES condenser 336 ultimately being returned to accumulator 106 after flowing around VCS loop 304. Compressor 326 may include a compressor inlet and a compressor outlet. VCS condenser 332 may include a VCS condenser inlet and a VCS condenser outlet. VCS-TES condenser 336 may include a first VCS-TES condenser inlet, a first VCS-TES condenser outlet, a second VCS-TES condenser inlet, and a second VCS-TES condenser outlet.

Each of the above various components forming VCS loop 304 may be in fluid communication with, and/or coupled to, one another via one or more conduits. For example, the second accumulator outlet may be in fluid communication with the compressor inlet by a second-accumulator-outlet conduit and a compressor-inlet conduit. Conduit junction 324 may be disposed between the second-accumulator-outlet conduit and the compressor-inlet conduit such that conduit junction 324 may be in fluid communication with, and/or coupled to, each of the second-accumulator-outlet conduit and the compressor-inlet conduit. The compressor outlet may be in fluid communication with, and/or coupled to, the VCS condenser inlet by compressor-VCS-condenser conduit 304. The VCS condenser outlet may be in fluid communication with, and/or coupled to, the first VCS-TES condenser inlet, by a VCS-condenser-condenser conduit. The first VCS-TES condenser outlet may be in fluid communication with, and/or coupled to, the second accumulator inlet by a VCS-TES-condenser-accumulator conduit. Primary fluid flow path 302 may further include vapor-return conduit 320 disposed between compressor-VCS-condenser conduit 306 and conduit junction 324. Vapor-return conduit 320 may be in fluid communication with, and/or coupled to, each of the compressor-VCS-condenser conduit and conduit junction 324.

Primary fluid flow path 302 may include one or more valves disposed within the conduits of primary fluid flow path 302 at preferable locations. For example, the second-accumulator-outlet conduit may include back-pressure regulator 322 disposed thereon. Compressor-VCS-condenser conduit 306 may include valve 330 disposed thereon, downstream of vapor-return conduit 320. In other examples, valve 330 may be downstream of the outlet of compressor 326 and upstream of vapor-return conduit 320. Valve 330 may be a passive check valve. The VCS-TES-condenser-accumulator conduit may include expansion valve 338 disposed thereon. Examples of expansion valve 338 may include a back-pressure regulator, a thermal expansion valve, and an electronic expansion valve. Vapor-return conduit 320 may include modulating vale 328 disposed thereon.

TES loop 310 may operate as a low-temperature sink for TPP loop 105, and operate as a heat source for TES evaporator 160, and consequently, VCS loop 304. Accordingly, TES loop 310 is configured to transfer heat from TPP loop 105, to the TES medium, and then at a later time to transfer heat from the TES medium, to VCS loop 304. TES loop 310 may be in fluid communication with the second TPPL condenser inlet, the second TPPL condenser outlet, the second TES evaporator inlet, and the second TES evaporator outlet. Accordingly, TES loop 310 is thermally coupled to primary fluid flow path 302 by each of TPPL condenser 104 and TES evaporator 160. TES loop 310 or TES medium flow path 308 includes various components configured to transfer heat from one location and dispose of, or reject, the heat into another location. For example, various components of TES loop 310 include TPPL condenser 104, warm-temperature tank 342, three-way valve 344, warm-temperature liquid pump 346, TES evaporator 160, cold-temperature tank 348, mix valve 350, and cold-temperature liquid pump 352. Warm-temperature tank 342 may also be referred to as a "first tank." Warm-temperature liquid pump 346 may also be referred to as a "first liquid pump." Cold-temperature tank 348 may also be referred to as a "second tank." Cold-temperature liquid pump 352 may also be referred to as a "second liquid pump." TES loop 310 may be arranged such that each subsequent component, as listed in the order above, may be located downstream of the prior components, and the effluent of cold-temperature liquid pump 352 ultimately being returned to the second TPPL condenser inlet after flowing around TES loop 310. Warm-temperature tank 342 may include a warm-temperature tank inlet and a warm-temperature tank outlet, and one or more sensors to detect depth of the TES medium in warm-temperature tank 342 at one or more respective predetermined set points. Warm-temperature liquid pump 346 may include a warm-temperature liquid pump inlet and a warm-temperature liquid pump outlet. Cold-temperature tank 348 may include a cold-temperature tank inlet, a cold-temperature tank outlet, and one or more sensors to detect depth of the TES medium in cold-temperature tank 348 at one or more respective predetermined set points. Cold-temperature liquid pump 352 may include a cold-temperature liquid pump inlet and a cold-temperature liquid pump outlet. TES loop 310 may be configured to maintain a temperature of the TES medium in cold-temperature tank 348 lower than a temperature of the TES medium in warm-temperature tank 342.

Each of the above components forming TES loop 310 may be in fluid communication with, and/or coupled to, one another via one or more conduits. Second TPPL condenser outlet may be in fluid communication with, and/or coupled to, warm-temperature tank 342, by a second-TPPL-condenser-outlet conduit and a warm-temperature-tank-inlet conduit. Conduit junction 340 may be disposed between the second-TPPL-condenser-outlet conduit and the warm-temperature-tank-inlet conduit such that conduit junction 340 may be in fluid communication with, and/or coupled to, each of the second-TPPL-condenser-outlet conduit and the warm-temperature-tank-inlet conduit. The warm-temperature tank outlet may be in fluid communication with, and/or coupled to, three-way valve 344. Three-way valve 344 also may be in fluid communication with, and/or coupled to, the warm-temperature liquid pump inlet by a warm-tank-liquid-pump conduit. The warm-temperature liquid pump outlet may be in fluid communication with, and/or coupled to, the second TES evaporator inlet by a liquid-pump-TES-evaporator conduit. The second TES evaporator outlet may be in fluid communication with, and/or coupled to, the cold-temperature tank inlet by a TES-evaporator-cold-tank conduit. The cold-temperature tank outlet may in fluid communication with, and/or coupled to mix valve 350 by a cold-temperature-tank-mix-valve conduit. The cold-temperature tank outlet may further be in fluid communication with, and/or coupled to, three-way valve 344 by cold-temperature-tank-three-way-valve conduit 312. Mix valve 350 may be in fluid communication with, and/or coupled to, the cold-temperature liquid pump inlet by a mix-valve-liquid-pump conduit. The cold-temperature liquid pump outlet may be in fluid communication with, and/or coupled to, the second TPPL condenser inlet by a liquid-pump-TPPL-condenser conduit. Conduit junction 340 may be in fluid communication with, and/or coupled to, mix valve 350 by junction-mix-valve conduit 318. The liquid-pump-TES-evaporator conduit 308 may be in fluid communication with, and/or coupled to, the second VCS-TES condenser inlet by liquid-pump-VCS-TES-condenser conduit 314. The second VCS-TES condenser outlet may be in fluid communication with, and/or coupled to, the warm-temperature tank inlet downstream of valve 354 by VCS-TES-condenser-outlet conduit 316.

Valve 354 may be disposed on the warm-temperature-tank-inlet conduit. Valve 354 may be a check valve with a cracking pressure. Modulating valve 358 may be disposed on VCS-TES-condenser-outlet conduit 316. Modulating valve 356 may be disposed on the liquid-pump-TES-evaporator conduit downstream of liquid-pump-VCS-TES-condenser conduit 314. Each of modulating valve 358 and modulating valve 356 may be a flow control valve. Each of modulating valve 358 and modulating valve 356 may independently and separately be open, partially open, or closed so as to advantageously adjust flow of TES medium on TES loop 310.

VCS condenser 332 may receive the higher-temperature/pressure primary fluid from compressor 326. VCS condenser 332 may be a heat exchanger that rejects heat from the primary fluid to a heat sink, which may be, for example, the ambient environment. Examples of VCS condenser 332 may include a parallel-flow, counter-flow, multi-pass-flow, and cross-flow heat exchanger. The primary fluid may run in hot-side channels of VCS condenser 332. Cold-side channels of VCS condenser 332 may be filled with a fluid from a heat sink, for example, ambient air. VCS condenser 332 may include a force ventilation unit, such as fan 334, which may increase the flow rate of the heat sink over VCS condenser 332. The "sizing" of VCS condenser 332 may factor in the addition of the force ventilation unit, such as fan 334. In some examples, VCS condenser 332 may also include one or more pumps for rejecting heat, for example, to water.

Compressor 326 may raise the pressure of the primary fluid. The increase in pressure in the primary fluid may be used to provide the workflow required to circulate the primary fluid within primary fluid flow path 302 and VCS loop 304. Raising the pressure of the primary fluid may also raise the temperature of the primary fluid, thereby allowing heat to be rejected from the primary fluid to the ambient environment in VCS condenser 332. In some examples, compressor 326 may be a device configured to raise the pressure of vapor-phase primary fluid.

Cold-temperature liquid pump 352 and warm-temperature liquid-pump 346 may raise the pressure of the TES medium and may provide workflow to move the TES medium downstream within TES loop 310.

VCS-TES condenser 336 may receive the primary fluid from VCS condenser 332 and the TES medium from liquid-pump-VCS-TES-condenser conduit 314. VCS-TES condenser 336 may be a heat exchanger that rejects heat from the primary fluid to a heat sink, which may be, for example, the TES medium. Examples of VCS-TES condenser 336 may include a parallel-flow, counter-flow, multi-pass-flow, and cross-flow heat exchanger. The primary fluid may run in hot-side channels of VCS-TES condenser 336. Cold-side channels of VCS-TES condenser 336 may be filled with a fluid from a heat sink, for example, the TES medium.

During operation of thermal management system 300, the temperature difference between the TES medium in cold-temperature tank 348 and warm-temperature tank 342 may be maintained to be at least a predetermined temperature difference. Examples of the predetermined temperature difference may be 5, 10, 15, 20, 30, 40, 60, 80, 100, 120, 140, 160, 180, or 200 degrees Celsius. Alternatively, the predetermined temperature difference may be any other temperature difference in other examples. The actual temperature difference between the TES medium in cold-temperature tank 348 and warm-temperature tank 342 may vary during operation of thermal management system 300 as thermal management system 300 maintains at least the predetermined temperature difference. Further, the predetermined temperature difference may itself vary during operation of thermal management system 300. The predetermined temperature difference may be a function of one or more system parameters such as temperature of TES medium in warm-temperature tank 342 and/or temperature of the primary fluid in TPP loop 105, among other parameters.

Mix valve 350 may be configured to control the temperature of the TES medium that flows to TPPL condenser 104 by mixing the TES medium flowing from TPPL condenser 104 through junction-mix-valve conduit 350 with the TES medium from cold-temperature tank 348. The temperature of the TES medium flowing to TPPL condenser 104 may consequently determine the amount of heat that is transferred in TPPL condenser 104.

Three-way valve 344 is disposed in TES loop 310 so as to provide for recharging of cold-temperature tank 348 during non-standard operation of TES loop 310. For example, if a significant amount of time has passed without using the TES medium passing through mix valve 350, cold-temperature liquid pump 352, TPPL condenser 104, and conduit junction 340, heat may be absorbed from the environment into cold-temperature tank 348 and increase the temperature of the cold-temperature TES medium in cold-temperature tank 348 to an unacceptable temperature. In this instance, cold-temperature tank 348 will need to be recharged. Three-way valve 344 may be set or configured to allow some or all of the cold-temperature TES medium in cold-temperature tank 348 to bypass primary thermal load 102 and TPPL condenser 104 by cold-temperature-tank-three-way-valve conduit 312.

It is desirable that the TES medium in cold-temperature tank 348 may be maintained at a cold temperature and the warm-temperature TES medium not be mixed back into cold-temperature tank 348. Instead, it is desirable that the warm-temperature TES medium may then be chilled and returned to cold-temperature tank 348 at the desired cold-temperature operating condition of cold-temperature tank 348. The cold-temperature TES medium may include, for example, the TES medium flowing downstream of TES evaporator 160 and upstream of mix valve 350 and in cold-temperature-tank-three-way-valve conduit 312. The warm-temperature TES medium may include, for example, the TES medium flowing downstream of TPPL condenser 104 and upstream of TES evaporator 160 and TES medium in junction-mix-valve conduit 318.

So as to advantageously limit TES size and weight, the temperature of TES medium in cold-temperature tank 348 may advantageously be as low as possible or at least lowered to some extent. Further, the temperature of the TES medium in warm-temperature tank 342 may advantageously be as high as possible or at least increased to some extent. Accordingly, the difference in temperature between the TES medium in cold-temperature tank 348 and the TES medium in warm-temperature tank 342 may advantageously be as high as possible or at least increased. By maximizing or even merely increasing the temperature difference between the TES medium in warm-temperature tank 342 and the TES medium in cold-temperature tank 348, the amount of the TES medium required to absorb the heat may be limited. Additionally, a larger temperature difference between cold-temperature TES medium and warm-temperature TES medium may provide a larger temperature difference across heat exchangers, which may enable smaller heat exchangers and decreased flow rates. Smaller heat exchangers and lower flow rates may result in reduced system power consumption and reduced system mass and volume relative to a TES loop that includes a single tank with TES medium that begins at the same minimum cold temperature as the TES medium in cold-temperature tank 348 as described herein, but that increases in temperature as heat is absorbed into the single TES tank.

By including both cold-temperature tank 348 and warm-temperature tank 342, flow rates through are minimized. The relatively low flow rate of the cold-temperature TES medium from cold-temperature tank 348 may advantageously result in only minor losses of pressure in mix valve 350. These low pressure losses, enable the tanks to operate at atmospheric pressure. Operating the tanks at atmospheric pressure may advantageously enable more light-weight tanks. Further, tanks at atmospheric pressure may be shaped as rectangular prisms or cuboid, which may advantageously enable the use of more efficient thermal insulation that may require less volume and/or enable better packing efficiency of the tanks. The respective flow rates of the TES medium into and out of warm-temperature tank 342 and cold-temperature tank 348 may not be equal. To advantageously minimize pressure differences between warm-temperature tank 342 and cold-temperature tank 348 and minimize venting to the ambient environment, a line (not shown) may connect the air and/or vapor portion of warm-temperature tank 342 and cold-temperature tank 348.

During operation, the predetermined temperature difference may be maintained by not returning warm-temperature TES medium to cold-temperature tank 348 until the TES medium is cooled to a predetermined temperature set point of cold-temperature tank 348. Rather, the warm-temperature TES medium is captured and stored in the warm tank until it can be cooled. When primary thermal load 102 is a high transient heat load, warm-temperature TES medium contained in warm-temperature tank 342 may flow through warm-temperature liquid pump 346, to VCS-TES condenser 336 to absorb more heat from the primary fluid. By increasing heat transfer from the primary fluid to the TES medium in VCS-TES condenser 336, compressor 326 may advantageously operate at a lower Saturated Discharge Temperature ("SDT"), which may in turn advantageously provide for compressor 326 to operate at a higher efficiency and/or higher flow rate and therefore require less TES medium from cold-temperature tank 348 to support cooling of primary thermal load 102 via TPPL condenser 104.

Further, VCS condenser 332 may be made smaller, and may require less support from a force ventilation unit, such as fan 334, if more heat is transferred in VCS-TES condenser 336. VCS-TES condenser 336 provides a liquid heat sink in the TES medium, thereby advantageously reducing overall system size significantly. More heat is advantageously stored in warm-temperature tank 342 during the high transient load, and advantageously transferred to VCS loop 304, and ultimately, the ambient environment when the high transient load has been reduced or eliminated. VCS-TES condenser 336 may not require additional TES medium, but may advantageously take advantage of the TES medium already accumulated in warm-temperature tank 342 from TPPL condenser 104.

Figure 4:
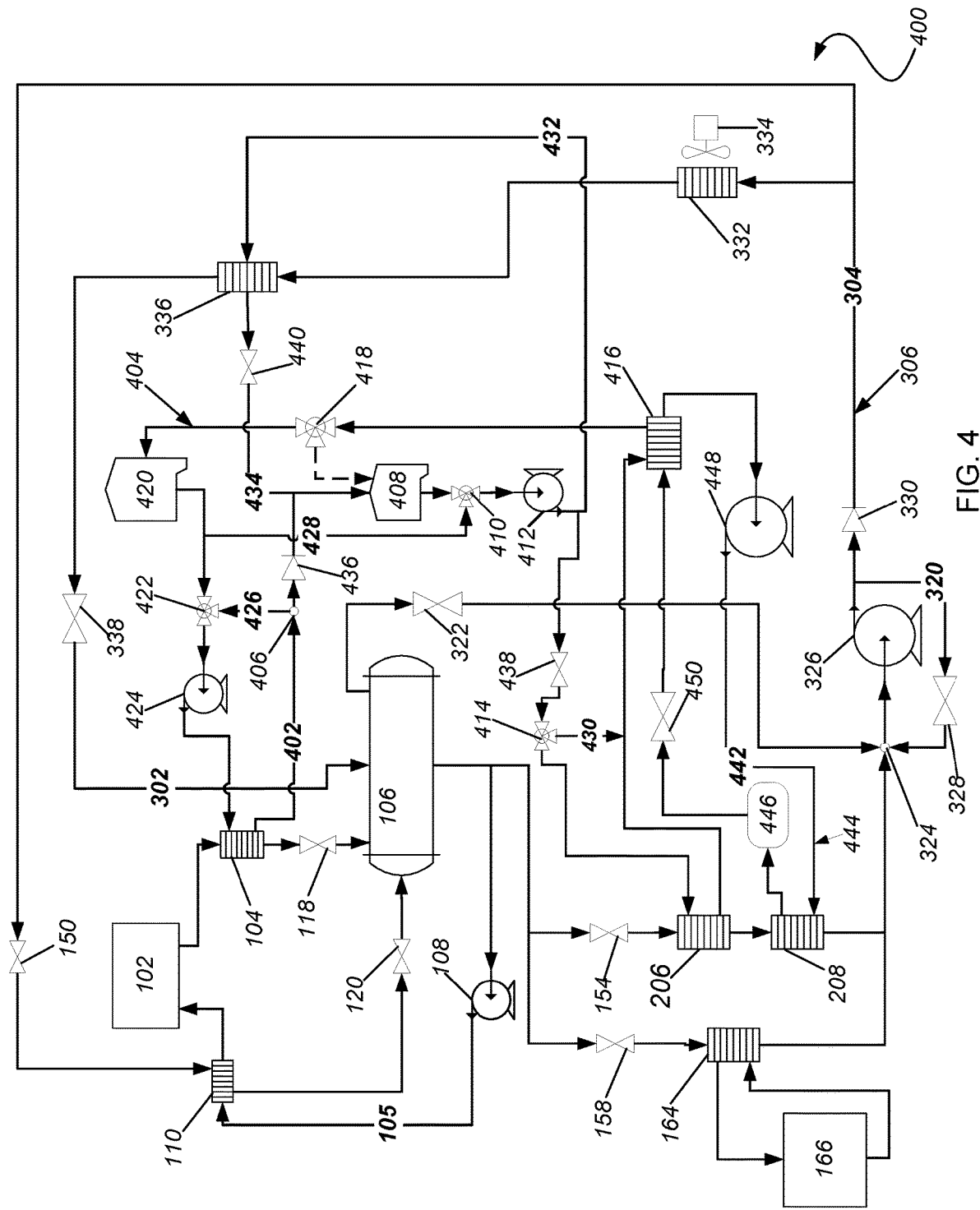
FIG. 4 illustrates a schematic of yet another example of a thermal management system according to the principles of the present disclosure.

FIG. 4 illustrates a schematic of yet another example of a thermal management system 400 to cool a transient heat load, for example, primary thermal load 102, and a steady-state load, for example, secondary thermal load 166. Thermal management system 400 includes TES loop 404, which may operate as a low-temperature sink for TPP loop 105, and operate as a heat source for high-temperature TES evaporator 206, and consequently, VCS loop 304.

Accordingly, TES loop 404 is configured to transfer heat from TPP loop 105 to the TES medium, and then at a later time to transfer heat from the TES medium, to VCS loop 304. TES loop 404 may be in fluid communication with the second TPPL condenser inlet, the second TPPL condenser outlet, the second high-temperature TES evaporator inlet, and the second high-temperature TES evaporator outlet. Accordingly, TES loop 404 is thermally coupled to primary fluid flow path 302 by each of TPPL condenser 104 and high-temperature TES evaporator 206. TES loop 404 or TES medium flow path 402 includes various components configured to transfer heat from one location and dispose of, or reject, the heat into another location. For example, various components of TES loop 404 include TPPL condenser 104, warm-temperature tank 408, first three-way valve 410, warm-temperature liquid pump 412, second three-way vale 414, high-temperature TES evaporator 206, low-temperature TES evaporator 416, third three-way valve 418, cold-temperature tank 420, mix valve 422, and cold-temperature liquid pump 424. Warm-temperature tank 408 may also be referred to as a "first tank." Warm-temperature liquid pump 412 may also be referred to as a "first liquid pump." Low-temperature TES evaporator 416 may also be referred to as a "second TES evaporator." Cold-temperature tank 420 may also be referred to as a "second tank." Cold-temperature liquid pump 424 may also be referred to as a "second liquid pump." TES loop 404 such that each subsequent component, as listed in the order above, may be located downstream of the prior components, and the effluent of cold-temperature liquid pump 424 ultimately being returned to second TPPL condenser inlet after flowing around TES loop 404. Warm-temperature tank 408 may include a warm-temperature tank inlet, a second warm-temperature tank inlet, and a warm-temperature tank outlet. Warm-temperature liquid pump 412 may include a warm-temperature liquid pump inlet and a warm-temperature liquid pump outlet. Low-temperature TES evaporator 416 may include a first low-temperature TES evaporator inlet, a first low-temperature TES evaporator outlet, a second low-temperature TES evaporator inlet, and a second low-temperature TES evaporator outlet. Cold-temperature tank 420 may include a cold-temperature tank inlet and a cold-temperature tank outlet. Cold-temperature liquid pump 424 may include a cold-temperature liquid pump inlet and a cold-temperature liquid pump outlet. TES loop 404 may further include VCS-TES condenser 336.

Each of the above components forming TES loop 404 may be in fluid communication with, and/or coupled to, one another via one or more conduits. The second TPPL condenser outlet may be in fluid communication with, and/or coupled to, warm-temperature tank 420, by a second-TPPL-condenser-outlet conduit and a warm-temperature-tank-inlet conduit. Conduit junction 406 may be disposed between the second-TPPL-condenser-outlet conduit and the warm-temperature-tank-inlet conduit, such that conduit junction 406 is in fluid communication with, and/or coupled to, each of the second-TPPL-condenser-outlet conduit and the warm-temperature-tank-inlet conduit. The warm-temperature tank outlet may be in fluid communication with, and/or coupled to, first three-way valve 410, by a warm-temperature-tank-outlet conduit. First three-way valve 410 may also be in fluid communication with, and/or coupled to, the warm-temperature liquid pump inlet by a warm-temperature-liquid-pump-inlet conduit. The warm-temperature liquid pump outlet may be in fluid communication with second three-way valve 414 by a warm-temperature-liquid-pump-outlet conduit. Second three-way valve 414 may also be in fluid communication with, and/or coupled to, the second high-temperature TES evaporator inlet by a second-high-temperature-TES-evaporator-inlet conduit. Second three-way valve 414 may also be in fluid communication with, and/or coupled to, a conduit junction downstream of high-temperature TES evaporator 206 and upstream of low-temperature evaporator 416 by evaporator-three-way-valve conduit 430. The second high-temperature TES evaporator outlet may be in fluid communication with, and/or coupled to, the first low-temperature TES evaporator inlet by a TES-evaporator-evaporator conduit. The first low-temperature TES evaporator outlet may in fluid communication with, and/or coupled to, third three-way valve 418 by a first-low-temperature-TES-evaporator-outlet conduit. Third three-way valve 418 may also be in fluid communication with, and/or coupled to, the cold-temperature tank inlet by a cold-temperature-tank-inlet conduit. The cold-temperature tank outlet may be in fluid communication with, and/or coupled to, mix valve 422 by a cold-temperature-tank-outlet conduit. Mix valve 422 may further be in fluid communication with, and/or coupled to, cold-temperature liquid pump inlet by a cold-temperature-liquid-pump-inlet conduit. The cold-temperature liquid pump outlet may be in fluid communication with, and/or coupled to, the second TPPL condenser inlet by a liquid-pump-TPPL-condenser conduit. Mix valve 422 may be in fluid communication with, and/or coupled to, conduit junction 406 by junction-mix-valve conduit 426.

TES loop 404 may further include second-VCS-TES-condenser-inlet conduit 432, which may be in fluid communication with, and/or coupled to, each of the warm-temperature-liquid-pump-outlet conduit upstream of second three-way valve 414, and the second VCS-TES condenser inlet. TES loop 404 may further include second-VCS-TES-condenser-outlet conduit 434, which may be in fluid communication with, and/or coupled to, each of the second VCS-TES condenser outlet, and the warm-temperature-tank-inlet conduit downstream of valve 436.

The TES-evaporator-evaporator conduit may further be in fluid communication with, and/or coupled to, second three-way valve 414 by evaporator-three-way-valve conduit 430.

The cold-temperature tank outlet may be in fluid communication with, and/or coupled to, first three-way valve 410, by cold-temperature-tank-three-way-valve conduit 428. Third three-way valve 418 may be in fluid communication with, and/or coupled to, the second warm-temperature tank inlet by a three-way-valve-warm-tank conduit.

Modulating valve 440 may be disposed on second-VCS-TES-condenser-outlet conduit 434. Modulating valve 438 may be disposed on TES loop 404 downstream of second-VCS-TES-condenser-inlet conduit 432 and upstream of second three-way valve 414. Each of modulating valve 440 and modulating valve 438 may be a flow control valve. Each of modulating valve 440 and modulating valve 438 may independently and separately be open, partially open, or closed so as to advantageously adjust flow of TES medium on TES loop 444. Valve 436 may be disposed on the warm-temperature-tank-inlet conduit. Valve 436 may be a check valve.

Thermal management system 400 may further include low-temperature VCS loop 444 in a cascaded architecture with, and thermally coupled to, TES loop 404, by low-temperature TES evaporator 416, and thermally coupled to primary fluid flow path 302 by low-temperature VCS condenser 208, such that low-temperature VCS loop 444 may reject heat from TES loop 404 to primary fluid flow path 302, which then may reject heat to the ambient environment in high-temperature VCS loop 304. Low-temperature VCS loop 444, or "second VCS loop," may include a low-temperature VCS fluid, or a "second VCS fluid," disposed in low-temperature VCS loop 444 and a second VCS fluid flow path 442. Low-temperature VCS loop 444 may include low-temperature VCS condenser 208, receiver 446, low-temperature TES evaporator 416, and low-temperature VCS compressor 448. Low-temperature TES evaporator 416 may also be referred to as "a second TES evaporator." Low-temperature VCS compressor 448 may also be referred to as a "VCS compressor." Low-temperature VCS loop 444 may be arranged such that each subsequent component, as listed in the order above, may be located downstream of the prior components, and the effluent of low-temperature VCS compressor 448 ultimately being returned to the second low-temperature VCS condenser inlet after flowing around low-temperature VCS loop 444. Receiver 446 may include a receiver inlet and a receiver outlet, and may be alternatively located in different positions around low-temperature VCS loop 444. Low-temperature VCS compressor 448 may include a low-temperature VCS compressor inlet and a low-temperature VCS-compressor outlet.

The second low-temperature VCS condenser outlet may be in fluid communication with, and/or coupled to, the receiver inlet by a condenser-receiver conduit. The receiver outlet may be in fluid communication with, and/or coupled to, the second low-temperature TES evaporator inlet by a receiver-TES-evaporator conduit. The second low-temperature TES evaporator outlet may be in fluid communication with, and/or coupled to, the low-temperature VCS compressor inlet by an evaporator-compressor conduit. The low-temperature VCS compressor outlet may be in fluid communication with, and/or coupled to, the second low-temperature VCS condenser inlet by a compressor-condenser conduit.

The receiver-TES-evaporator conduit may include expansion valve 450. Examples of expansion valve 450 may include a back-pressure regulator, a thermal expansion valve, and an electronic expansion valve.

The low-temperature VCS fluid may be any substance suitable for use in low-temperature VCS loop 444.

Low-temperature VCS compressor 448 may raise the pressure of the low-temperature VCS fluid. The increase in pressure in the low-temperature VCS fluid may be used to provide the workflow required to circulate the low-temperature VCS fluid within low-temperature VCS loop 444. Raising the pressure of the low-temperature VCS fluid may also raise the temperature of the low-temperature VCS fluid, thereby allowing heat previously absorbed from the TES medium to be rejected from the low-temperature VCS fluid and, subsequently, the ambient environment in VCS condenser 332.

Receiver 446 may be a reservoir that performs many functions in low-temperature VCS loop 444, including, but not limited to, providing a flow of low-temperature VCS fluid to low-temperature TES evaporator 416.

Cold-temperature liquid pump 424 and warm-temperature liquid pump 412 may raise the pressure of the TES medium and may provide workflow to move the TES medium downstream within TES loop 404.

During operation of thermal management system 400, TPPL 105, high-temperature VCS loop 304, TES loop 404, and low-temperature VCS loop 444 may maintain the temperature difference between the TES medium in cold-temperature tank 420 and warm-temperature tank 408 to be at least a predetermined temperature difference. The predetermined temperature difference may be maintained by controlling flow of the TES medium through modulating valve 438 to high-temperature TES evaporator 206, which may transfer heat to the primary fluid.

Alternatively, or in addition, the predetermined temperature difference may be maintained by controlling flow of the TES medium through third three-way valve 418 to cold-temperature tank 420 and/or warm-temperature tank 408. Alternatively, or in addition, the predetermined temperature difference may be maintained by controlling flow of the low-temperature VCS fluid through expansion valve 450, thereby controlling transfer of heat from the TES medium to the low-temperature VCS fluid across low-temperature TES evaporator 416 and transfer of heat from the low-temperature VCS fluid to the primary fluid across low-temperature VCS condenser 208. Alternatively, or in addition, the predetermined temperature difference may be maintained by controlling flow of the TES medium through modulating valve 440 from VCS-TES condenser 336 to warm-temperature tank 408. The temperature difference can also be maintained by varying warm-temperature liquid pump 412 speed, which controls flow rate.

When primary thermal load 102 is a high transient heat load, warm-temperature TES medium entering warm-temperature tank 408 may flow to VCS-TES condenser 336 to absorb more heat from the primary fluid. By increasing heat transfer from the primary fluid to the TES medium in VCS-TES condenser 336, compressor 326 may advantageously operate at a lower Saturation Discharge Temperature (SDT), which may in turn advantageously provide for compressor 326 to operate at a higher efficiency and/or higher flow rate and therefore require less TES medium from cold-temperature tank 420 to support cooling of primary thermal load 102 via TPPL condenser 104. The predetermined temperature difference is selected such that the TES medium in cold-temperature tank 420 is colder than in warm-temperature tank 408. Examples of the predetermined temperature difference may be 5, 10, 15, 20, 30, 40, 60, 80, 100, 120, 140, 160, 180, or 200 degrees Celsius. Alternatively, the predetermined temperature difference may be any other temperature difference in other examples. The actual temperature difference may be any other temperature difference in other examples. The actual temperature difference between the TES medium in cold-temperature tank 420 and warm-temperature tank 408 may vary during operation of thermal management system 400 as thermal management system 400 maintains at least the predetermined temperature difference. Further, the predetermined temperature difference may itself vary during operation of thermal management system 400. The predetermined temperature difference may be a function of one or more system parameters such as temperature of the TES medium in warm-temperature tank 408 and/or temperature of the primary fluid in TPP loop 105, among other parameters.

It is desirable that the TES medium in cold-temperature tank 420 may be maintained at a cold-temperature and warm-temperature TES medium not be mixed back into cold-temperature tank 420. Instead, it is desirable that warm-temperature TES medium is collected in warm-temperature tank 408 for storage. The warm-temperature TES medium may then be chilled and returned to cold-temperature tank 420 at the desired cold-temperature operating condition of cold-temperature tank 420.

So as to advantageously limit TES size and weight, the temperature of the TES medium in cold-temperature tank 420 may advantageously be as low as possible or at least lowered to some extent. Further, the temperature of the TES medium in warm-temperature tank 408 may advantageously be as high as possible or at least increased to some extent. Accordingly, the difference in temperature between the TES medium in cold-temperature tank 420 and the TES medium in warm-temperature tank 408 may advantageously be as high as possible or at least increased. By maximizing or even merely increasing the temperature difference between the TES medium in warm-temperature tank 408 and the TES medium in cold-temperature tank 420, the amount of the TES medium required to absorb the heat may be limited. Additionally, a larger temperature difference between cold-temperature TES medium and warm-temperature TES medium may provide a larger temperature difference across heat exchangers, which may enable smaller heat exchangers and reduced flow rates. Smaller heat exchangers and reduced flow rates may result in reduced system power consumption and reduced system mass and volume relative to a TES loop that includes a single tank with TES medium starting at the same minimum initial cold temperature but that increases in temperature as heat is added.

When the ambient heat sink temperature falls, low-temperature VCS loop 444 and VCS loop 304 may have increased cooling capacity. Advantageously, low-temperature VCS compressor 448 may be turned off at a predetermined set point, and only VCS loop 304, including compressor 326, be used to reject heat to the ambient environment. Further, less condensing in TPPL condenser 104 may be necessary to reject heat as the cooling capacity of VCS loop 304 increase, and the TES medium in cold-temperature tank 420 would not be needed to be cooled to a temperature as low as when the heat temperature is higher. When cooling capacity of VCS loop 304 is sufficiently high, and ambient heat sink is sufficiently low, no condensing may need to be performed by TPPL condenser 104, in which case third three-way valve 418 may route or divert or may be configured to route or divert some or all cold-temperature TES medium to warm-temperature tank 408 via the three-way-valve-warm-tank conduit instead of cold-temperature tank 420, and cold-temperature liquid pump 424 may be turned off.

First three-way valve 410 is disposed in TES loop 404 so as to provide for recharging of cold-temperature tank 420 during non-standard operation of TES loop 404. For example, if a significant amount of time has passed without using the TES medium passing through mix valve 422, cold-temperature liquid pump 424, TPPL condenser 104, and conduit junction 406, heat may be absorbed from the environment into cold-temperature tank 420 and increase the temperature of the cold-temperature TES medium in cold-temperature tank 420 to an unacceptable temperature. In this instance, cold-temperature tank 420 will need to be recharged. First three-way valve 410 may be set or configured to allow some or all of the cold-temperature TES medium in cold-temperature tank 420 to bypass primary thermal load 102 and TPPL condenser 104 by cold-temperature-tank-three-way-valve conduit 428.

To support recharging of the cold tank, during non-standard operation, second three-way valve 414 may be used. In this state, the TES medium in cold-temperature tank 420 may be quite low in temperature and may need only minimal temperature reduction. Therefore, the TES medium may not be sent to high-temperature TES evaporator 206, where the TES medium may actually absorb heat and make the system less efficient. Therefore, when the TES medium may be relatively low in temperature, for example at or below a predetermined temperature set point, second three-way valve 414 may be configured to bypass high-temperature TES evaporator 206 and send the TES medium directly to low-temperature TES evaporator 416.

An example of a method of transferring heat from one or more thermal loads to the ambient environment may include the steps of: transferring heat from primary thermal load 102 to a primary fluid disposed in two-phase pump loop 105 ("TPPL") in fluid communication with vapor compression system ("VCS") loop 109; transferring heat from the primary fluid to a thermal energy storage ("TES") medium disposed in TES loop 107; transferring heat from the TES medium to the primary fluid across first TES evaporator 160 in first-TES-evaporator conduit 152 in fluid communication with TPPL 105 and VCS loop 109; transferring heat from the primary fluid to an ambient environment across VCS condenser 124 in VCS loop 109; and maintaining a temperature of the TES medium in cold-temperature tank 170 lower than a temperature of the TES medium in warm-temperature tank 194.

Another example of a method of transferring heat from one or more thermal loads to the ambient environment may further include the step of: mixing the TES medium flowing from TPPL condenser 104 in TES loop 107 with the TES medium flowing from cold-temperature tank 170 in mix valve 184 to provide TES medium at a predetermined temperature above the temperature of the TES medium in cold-temperature tank 170 to TPPL condenser 104.

Another example of a method of transferring heat from one or more thermal loads to the ambient environment may further include the step of: expanding the primary fluid across thermal expansion valve 154 disposed on first-TES-evaporator conduit 152 prior to transferring heat from the TES medium to the vapor-phase primary fluid in first TES evaporator 160.

Another example of a method of transferring heat from one or more thermal loads to the ambient environment may further include the step of: transferring heat from secondary thermal load 166 in secondary load cooling loop 168 to the primary fluid across secondary evaporator 164 in secondary-evaporator conduit 156 in fluid communication with first-TES-evaporator conduit 152 upstream and downstream of first TES evaporator 160, secondary evaporator 164 parallel to first TES evaporator 160.

Another example of a method of transferring heat from one or more thermal loads to the ambient environment may further include the step of: expanding the primary fluid in thermal expansion valve 158 disposed in secondary-evaporator conduit 156 upstream of secondary evaporator 164.

Another example of a method of transferring heat from one or more thermal loads to the ambient environment may further include the step of: at least partially diverting delivery of the TES medium from cold-temperature tank 256 to warm-temperature tank 236 through three-way valve 252 in TES loop 201 in response to an ambient temperature being at or below a predetermined temperature set point, three-way valve 252 downstream of and in fluid communication with first TES evaporator 160, upstream of and in fluid communication with cold-temperature tank 256, and in fluid communication with warm-temperature tank 236.

Another example of a method of transferring heat from one or more thermal loads to the ambient environment may further include the step of: increasing flow of the TES medium through modulating valve 234 disposed on TES loop 201 from VCS-TES condenser 216 to warm-temperature tank 236 in response to an increase in primary thermal load 102; and transferring heat from the primary fluid to the TES medium across VCS-TES condenser 216, which is in fluid communication with TES loop 201 upstream of warm-temperature tank 236.

Another example of a method of transferring heat from one or more thermal loads to the ambient environment may further include the steps of: transferring heat from the TES medium to low-temperature VCS loop 203 across a second TES evaporator 248 in TES loop 201 downstream of and in fluid communication with first TES evaporator 206 and upstream of and in fluid communication with cold-temperature tank 256; transferring heat from low-temperature VCS loop 203 to the primary fluid across second VCS condenser 208 in first-TES-evaporator conduit 202 and downstream of and in fluid communication with first TES evaporator 206; and maintaining a temperature of the TES medium in cold-temperature tank 256 at a temperature at least a predetermined temperature difference lower than a temperature of the TES medium in warm-temperature tank 236.

Another example of a method of transferring heat from one or more thermal loads to the ambient environment may further include the steps of: setting three-way valve 414 in TES loop 404 to divert flow of the TES medium from warm-temperature tank 408 to junction-three-way-valve conduit 430 and bypass first TES evaporator 206; setting three-way-valve 410 in TES loop 404 to stop flow of TES medium from warm-temperature tank 408 and open to flow of the TES medium from cold-temperature tank 420; wherein the temperature of the TES medium in cold-temperature tank 420 is at a temperature at least a predetermined temperature difference lower than the temperature of the TES medium in warm-temperature tank 408; and wherein the temperature of the TES medium in cold-temperature tank 408 is at or above a second predetermined temperature set point.

Examples of the thermal management systems of the present disclosure may additionally include memory 298 and processor 296. Processor 296 may be in communication with memory 298 and a network interface (not shown in FIGS. 1 and 2). In one example, processor 296 may also be in communication with additional elements, such as a display (not shown in FIGS. 1 and 2). Examples of processor 296 may include a controller, a general processor, a central processing unit, a microcontroller, a server, an application specific integrated circuit ("ASIC"), a digital signal processor, a field programmable gate array ("FPGA"), a digital circuit, and/or an analog circuit.

Processor 296 may be one or more devices operable to execute logic. The logic may include computer executable instructions or computer code embodied in memory 298 or in other memory that, when executed by processor 296, may cause processor 296 to perform the features implemented by the logic. The computer code may include instructions executable with processor 296.

The processing capability of thermal management systems of the present disclosure may be distributed among multiple entities, such as among multiple processors and memories, optionally including multiple distributed processing systems.

Processor 296 may advantageously control each of back-pressure regulator 118, modulating valve 120, back-pressure regulator 132, expansion valve 140, modulating valve 146, modulating valve 150, expansion valve 154, expansion valve 158, mix valve 174, thermal expansion valve 204, expansion valve 222, modulating valve 234, modulating valve 244, three-way valve 252, mix valve 260, expansion valve 274, modulating valve 288, and/or modulating valve 292, back-pressure regulator 322, modulating valve 328, valve 330, expansion valve 338, modulating valve 356, modulating valve 358, mix valve 350, three-way valve 344, modulating valve 438, modulating valve 440, expansion valve 450, mix valve 422, first three-way valve 410, second three-way valve 414, and/or third three-way valve 418 to separately position such valves open, partially open, or closed as necessary, desirable, or preferable to a particular operation of a thermal management system of the present disclosure. Processor 296 may advantageously control each of TPPL liquid pump 108, compressor 122, fan 126, cold-temperature liquid pump 178, warm-temperature liquid pump 198, fan 214, cold-temperature liquid pump 266, warm-temperature liquid pump 238, low-temperature VCS compressor 282, compressor 326, fan 334, warm-temperature liquid pump 346, cold-temperature liquid pump 352, warm-temperature liquid pump 412, cold-temperature liquid pump 424, and/or low-temperature VCS compressor 448 to switch any pump or compressor on or off, and/or increase or decrease speed and/or power to any pump or compressor. Processor 296 may advantageously control and/or monitor one or more set points and/or detect an indication, such as an indication of a volume or a temperature or a pressure or an actual or anticipated thermal load increase or decrease via one or more sensors, in each of accumulator 106, cold-temperature tank 170, warm-temperature tank 194, cold-temperature tank 256, warm-temperature tank 236, low-temperature VCS accumulator 278, cold-temperature tank 348, warm-temperature tank 342, cold-temperature tank 420, warm-temperature tank 408, and/or receiver 446 to advantageously implement various pre-determined routines.

FIG. 5 illustrates an example of flow diagram 500 of operations of a thermal management system. Start 502 of flow diagram 500 is at primary thermal load 102, and prior to introduction of primary thermal load 102 to thermal management system, TES medium in cold-temperature tank 170 is at or below a predetermined temperature and/or volume set point. Processes 504, 506, 508, 518, 510 may be performed in any sequence, and all or some of processes 504, 506, 508, 518, and 510 may be performed simultaneously. Process 504 is to transfer heat from primary thermal load 102 to the primary fluid in the TPP loop. Process 506 is to transfer heat from the primary fluid to the TES medium in TPPL condenser 104. Process 508 is to transfer heat from the TES medium to the primary fluid in first TES evaporator 160. Process 508 may additionally include transferring heat from the TES medium to the low-temperature VCS fluid in low-temperature TES evaporator 248 and then transferring heat from the low-temperature VCS fluid to the primary fluid in low-temperature VCS condenser 208. Process 518 is to transfer heat from the primary fluid to the TES medium in VCS-TES condenser 216. Process 510 is to transfer heat from the primary fluid to the ambient environment in VCS condenser 212. Additional optional start 514 is at secondary thermal load 166. Process 516 is to transfer heat from secondary thermal load 166 to the primary fluid in secondary evaporator 164. End 512, which may occur after one or more of processes 504, 506, 508, 518, 510 is to maintain the primary fluid at a substantially constant temperature in TPPL 105 and to maintain a temperature of the TES medium in cold-temperature tank 256 lower than a temperature of the TES medium in warm-temperature tank 236, at which point, for example, operations may end.

The terms "modulate," "modulated," and "modulating," as used herein, unless stated otherwise, alone or in combination with other terms, refer to adjusting, varying, or tempering the setting on a valve such that the valve is advantageously positioned between fully open and fully closed.

In examples of the present disclosure, the term "partially open," as used herein, unless stated otherwise, alone or in combination with other terms, may refer to any position of a valve between the position of being completely open (for example, 100%) and completely closed (for example, 0% open). A partially open position may advantageously vary by example. A partially open position, in certain examples, may be such position such that a valve may advantageously increase or decrease pressure in fluid to a small degree, and/or advantageously increase or decrease temperature in fluid to a small degree, and/or advantageously increase or decrease fluid flow to a small degree. Such partially open positions providing specific advantageous pressure and/or temperature and/or flow conditions to fluid as necessary, desirable, or preferable may be understood by a person of ordinary skill.

A thermal management system of the present disclosure may regulate dissipation of multiple thermal loads. In some examples, the multiple thermal loads may arise during operation of an apparatus. The thermal management system of the present disclosure allows for heat dissipation or rejection of multiple thermal loads, including multiple parallel thermal loads, that may arise in many applications, including applications involving an apparatus operated with high energy consumption. The heat arising during the operation of such an apparatus may be transient or steady-state and transferred into the thermal management system by any means known in the art, including, but not limited to, using a two-phase pump ("TPP") loop ("TPPL," or "TPP loop"), a VCS loop, a fluid or fluid mixture system, or an air conditioning system in conjunction with any type of fluid, coolant, or refrigerant.

A "steady-state" heat load or thermal load, as used herein, unless stated otherwise, alone or in combination with other terms, may refer to a heat load or thermal load that dissipates a substantially constant amount of thermal energy to a thermal management system during operation of the thermal management system or during a substantial portion of the operation of the thermal management system.

For the purpose of this disclosure, the phrase "substantially constant," with respect to temperature, describes a temperature condition that is stable and exhibits minimal variation, such as within a predetermined tolerance. The predetermined tolerance may be, for example, ±5° C., ±3° C., ±1° C., or ±0.5° C., ±0.2° C., or ±0.1° C. Alternatively, the predetermined tolerance may mean that the substantially constant temperature stays within a predetermined percentage of a constant temperature, such as within 1, 2, 3, or 5 percent of the constant temperature. For the purpose of this disclosure, the phrase "substantial portion" may mean at least 50 percent.

In response to a variable or high transient heat load, a thermal management system of the present disclosure may change operation. The term "transient state," as used herein, unless stated otherwise, alone or in combination with other terms, refers to a thermal management system of the present disclosure operating in response to a variable or high transient or transient heat load or thermal load. A "variable" or "high transient" or "transient" heat load or thermal load, as used herein, unless stated otherwise, alone or in combination with other terms, refers to a load that temporarily increases in thermal power as a function of time, relative to a more common low power load. The term "low power load" may be a steady state load of any power level that is lower than a peak of the transient heat load. In various examples of a thermal management system of the present disclosure, a variable or high transient or transient heat load or thermal load may represent a load that temporarily increases in thermal power at least 10%; at least 30%; at least 50%; at least 75%; at least 100%; at least 200%; at least 400%; at least 800%; at least 1000%; at least 2000%; at least 3000%; at least 4000%; at least 5000%; at least 6000%; at least 7000%; at least 8000%; at least 9000%; at least 10000%; at least 11000%; at least 12000%; at least 13000%; at least 14000%; at least 15000% relative to a more common low power load.

The term "duty cycle," as used herein, unless stated otherwise, alone or in combination with other terms, refers to the duration of a variable or high transient or transient heat load or thermal load as a percent of the total time of a complete cycle, as represented by the percentage of a period of time, during which a thermal management system is at high power relative to the total time of the high power and low power conditions. One period of time is the duration of the total time of the high power and low power conditions. In various examples of a thermal management system of the present disclosure, a duty cycle is less than 0.01%; less than 0.1%; less than 1%; less than 2%; less than 3%; less than 4%; less than 5%; less than 10%; less than 15%; less than 20%; less than 25%; less than 30%; less than 40%; less than 50%; less than 60%; less than 70%; less than 80%; less than 90%.

The thermal loads dissipated by the thermal management system may be at different temperatures, with a thermal energy storage ("TES") constrained not to exceed the minimum of these temperatures. In some examples, the thermal loads may include a primary thermal load in the form of heat arising from an apparatus, and a second thermal load in the form of one of a housekeeping thermal load required to operate the apparatus, and/or platform thermal loads, and/or thermal loads associated with conditioning, distributing, or converting power. The thermal loads associated with conditioning, distributing, or converting power include, but are not limited to, thermal loads associated with power electronics, batteries, electric machines, or control systems. In other examples, a primary thermal load is at a higher temperature than a secondary thermal load. In other examples, a secondary thermal load is at a higher temperature than a primary thermal load. In further examples, a secondary thermal load is a steady-stated heat load or thermal load.

The design of the thermal management systems of the present disclosure allows for control of the fluid or fluid mixture temperature, the flow of the fluid or fluid mixture, or both, depending upon the requirements of the application. The design also provides thermal energy storage ("TES"), such that the thermal management system may be a practical, operable, and package-able solution when an application requires the use of a TPPL to remove heat from a high-energy system and has one or more housekeeping, secondary, or steady-state loads that use a different fluid and/or are at a different temperature.

The following description is merely exemplary in nature and is in no way intended to limit the present disclosure or its application or uses. The incorporation and use of such a thermal management system in industrial and military applications that include any apparatus, device, or combination of apparatuses or devices that consume electricity and may benefit from cooling and/or heating are contemplated to be within the scope of the present disclosure. Several examples of such an apparatus or device includes, without limitation, solid state electronics, a light-emitting diode ("LED"), an analog circuit, a digital circuit, a computer, a server, a server farm, a data center, a hoteling circuit such as vehicle electronics, a vehicle such as an aircraft, a directed-energy weapon, a laser, a plasma weapon, a railgun, a microwave generator, a pulse-powered device, a satellite uplink, an electric motor, an electric device, or the like.

For the purpose of this disclosure, the terms "about" and "substantially" are used herein with respect to measurable values and ranges due to expected variations known to those skilled in the art (for example, limitations and variability in measurements).

In describing elements of the present disclosure, the ordinal number terms "1st," "2nd" "first," "second," and the like, may be used herein. These ordinal number terms are only used to distinguish one element from another element, but do not limit the corresponding elements irrespective of the nature or order of the corresponding elements.

In describing elements of the present disclosure, the terms "upstream" and "downstream" refer to the relative direction with respect to fluid flow in a fluid pathway. For example, "upstream" refers to the direction from which the fluid flows, and "downstream" refers to the direction to which the fluid flows.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various examples have been described, it will be apparent to those of ordinary skill in the art that many more implementations are possible. Accordingly, the examples described herein are not the only possible implementations.

The subject-matter of the disclosure may also relate, among others, to the following aspects:

A first aspect relates to a thermal management system comprising: a thermal energy storage ("TES") loop comprising a TES medium disposed in the TES loop, a TPPL condenser, a first tank, a first liquid pump, a first TES evaporator, a second tank, and a second liquid pump; and a primary fluid flow path comprising a primary fluid disposed in the primary fluid flow path, a two-phase pump loop ("TPPL"), a vapor compression system ("VCS") loop, an accumulator, and a first-TES-evaporator branch; and wherein the TPPL is configured to cool a primary thermal load, the TPPL comprising a TPPL liquid pump and the TPPL condenser, the TPPL condenser configured to transfer heat from the primary fluid in the TPPL to the TES medium; wherein the VCS loop is configured to transfer heat from the primary fluid in the primary fluid flow path to an ambient environment via a VCS condenser; wherein the accumulator is configured to separate the primary fluid received from the TPPL and the VCS loop into a vapor-phase primary fluid and a liquid-phase primary fluid; wherein the first-TES-evaporator branch comprises the first TES evaporator and is in fluid communication with the TPPL downstream of the accumulator and with the VCS loop upstream of the compressor, wherein the first TES evaporator is configured to transfer heat from the TES medium to the VCS loop; wherein the TES loop is configured to, during the operation of the thermal management system, transfer heat to the ambient environment via the VCS loop and maintain the primary fluid supplied to the primary thermal load in the TPPL at a substantially constant temperature; and wherein the VCS loop and the TES loop are configured to, during operation of the thermal management system, maintain the TES medium in the second tank at a temperature that is lower than a temperature of the TES medium in the first tank.

A second aspect relates to the thermal management system of aspect 1, wherein the VCS loop comprises a VCS vapor-phase primary fluid flow path from the accumulator and returning to the accumulator, the VCS vapor-phase primary fluid flow path comprising, in a direction of VCS vapor-phase fluid flow, a compressor, the VCS condenser, and a VCS-TES condenser; wherein the VCS-TES condenser is thermally coupled to the TES loop downstream of the first liquid lump and upstream of the first tank; and wherein the VCS-TES condenser is configured to transfer heat from the primary fluid to the TES medium.

A third aspect relates to the thermal management system of aspect 2, wherein the TES loop further comprises a modulating valve upstream of or downstream of the VCS-TES condenser and upstream of the first tank; and wherein when the primary thermal load increases, the modulating valve is configured to increase flow of the TES medium through the VCS-TES condenser to the first tank.

A fourth aspect relates to the thermal management system of any preceding aspect, further comprising: a secondary load cooling loop configured to cool a secondary thermal load, the secondary load cooling loop comprising a fluid disposed in the secondary load cooling loop, a secondary evaporator, and a pump; a secondary-evaporator branch in fluid communication with the first-TES-evaporator branch, at points upstream and downstream of the first TES evaporator, the secondary-evaporator branch comprising a secondary evaporator in parallel with the first TES evaporator, the secondary evaporator configured to transfer heat from the secondary thermal load to the VCS loop; and an expansion valve disposed on the secondary-evaporator branch upstream of the secondary evaporator and configured to expand the vapor-phase primary fluid.

A fifth aspect relates to the thermal management system of any preceding aspect, wherein the TES loop further comprises a conduit junction, a mix valve, and a TES medium flowpath extending from an outlet of the TPPL condenser to an inlet of the TPPL condenser, the TES medium flowpath comprising, in a direction of TES medium flow: the conduit junction, the first tank, the first liquid pump, the first TES evaporator, the second tank, the mix valve, and the second liquid pump; wherein the conduit junction is in fluid communication with the mix valve by a junction-mix-valve conduit; and wherein the mix valve is configured to control the temperature of the TES medium that flows to the TPPL condenser by mixing the TES medium flowing from the TPPL condenser through the junction-mix-valve conduit with the TES medium from the second tank.

A sixth aspect relates to the thermal management system of any preceding aspect, wherein the TES loop further comprises a three-way valve downstream of and in fluid communication with the first TES evaporator, upstream of and in fluid communication with the second tank, and in fluid communication with the first tank; and wherein the three-way valve is configured to at least partially divert delivery of the TES medium from the second tank to the first tank when the ambient temperature is at or below a predetermined temperature set point.

A seventh aspect relates to the thermal management system of any preceding aspect, further comprising: a second VCS condenser disposed on the first-TES-evaporator branch upstream of or downstream of and in fluid communication with the first TES evaporator; and a second VCS loop, the second VCS loop comprising a VCS fluid disposed in the second VCS loop, the second VCS condenser, and a second TES evaporator; wherein the TES loop comprises the second TES evaporator downstream of and in fluid communication with the first TES evaporator and upstream of and in fluid communication with the second tank, the second TES evaporator configured to transfer heat from the TES loop to the second VCS loop; and wherein the second VCS loop is configured to maintain the temperature of the TES medium in the second tank at a temperature at least a predetermined temperature difference lower than the temperature of the TES medium in the first tank during operation of the thermal management system.

An eighth aspect relates to the thermal management system of any preceding aspect, further comprising a first expansion valve disposed on the first-TES-evaporator branch upstream of the first TES evaporator and configured to expand the vapor-phase primary fluid.

A ninth aspect relates to the thermal management system of any preceding aspect, wherein the TES loop further comprises a second three-way valve and a third three-way valve; wherein the second three-way valve is in fluid communication with the first liquid pump, in fluid communication with the first TES evaporator, and in fluid communication with a conduit junction downstream of the first TES evaporator by a junction-three-way-valve conduit; wherein the third three-way valve is in fluid communication with an outlet of the first tank, in fluid communication with the first liquid pump, and in fluid communication with an outlet of the second tank; wherein the second three-way valve is configured to divert the TES medium flowing from the first liquid pump to the junction-three-way-valve conduit and bypass the first TES evaporator when the TES medium in the second tank is at a temperature at or above a second predetermined temperature set point; and wherein the third three-way valve is configured to close to flow of the TES medium from the outlet of the first tank and open to flow of TES medium from the second tank when the TES medium in the second tank is at the temperature at or above the second predetermined temperature set point.

A tenth aspect relates to the thermal management system of any preceding aspect, wherein the accumulator is in fluid communication with the TPPL and the first VCS loop; and wherein the primary fluid flow path further comprises a processor configured to cause: the TPPL to transfer heat from the primary thermal load to the primary fluid; the TPPL condenser to transfer heat from the primary fluid to the TES medium; the first TES evaporator to transfer heat from the TES medium to the primary fluid; the VCS condenser to transfer heat from the primary fluid to the ambient environment; the TES loop to transfer heat to the ambient environment via the VCS loop and to maintain the primary fluid supplied to the primary thermal load at a substantially constant temperature; and the TES loop and the VCS loop to maintain a temperature of the TES medium in the second tank lower than a temperature of the TES medium in the first tank.

An eleventh aspect relates to the thermal management system of aspect 10, wherein the processor is configured to cause the secondary evaporator to transfer heat from the secondary thermal load to the primary fluid.

A twelfth aspect relates to a method of transferring heat from one or more thermal loads to an ambient environment, comprising: transferring heat from a primary thermal load to a primary fluid disposed in a two-phase pump loop ("TPPL") in fluid communication with a vapor compression system ("VCS") loop; transferring heat across a TPPL condenser from the primary fluid to a thermal energy storage ("TES") medium disposed in a TES loop; transferring heat from the TES medium to the primary fluid across a first TES evaporator in a first-TES-evaporator branch in fluid communication with the TPPL and the VCS loop; transferring heat from the primary fluid to the ambient environment across a VCS condenser in the VCS loop; and maintaining a temperature of the TES medium in a second tank in the TES loop lower than temperature of the TES medium in a first tank in the TES loop.

A thirteenth aspect relates to the method of aspect 12, further comprising: mixing the TES medium flowing from the TPPL condenser in the TES loop with the TES medium flowing from the second tank in a mix valve, so as to provide the TES medium to the TPPL condenser at a predetermined temperature difference above the temperature of the TES medium in the second tank.

A fourteenth aspect relates to the method of any of aspects 12 and 13, further comprising: expanding the primary fluid across a first expansion valve disposed on the first-TES-evaporator branch prior to transferring heat from the TES medium to vapor-phase primary fluid in the first TES evaporator.

A fifteenth aspect relates to the method of any of aspects 12 to 14, further comprising: transferring heat from a secondary thermal load in a secondary cooling loop to the primary fluid across a secondary evaporator in a secondary-evaporator branch in fluid communication with the first-TES-evaporator branch upstream and downstream of the first TES evaporator, the secondary evaporator parallel to the first TES evaporator.

A sixteenth aspect relates to the method of any of aspects 12 to 15, further comprising: expanding the primary fluid in a second expansion valve disposed in the secondary-evaporator branch upstream of the secondary evaporator.

A seventeenth aspect relates to the method of any of aspects 12 to 16, further comprising: at least partially diverting delivery of the TES medium from the second tank to the first tank through a three-way valve in the TES loop in response to an ambient temperature being at or below a predetermined temperature set point, the three-way valve downstream of and in fluid communication with the first TES evaporator, upstream of and in fluid communication with the second tank, and in fluid communication with the first tank.

An eighteenth aspect relates to the method of any of aspects 12 to 17, further comprising: increasing flow of the TES medium through a modulating valve disposed on the TES loop from a VCS-TES condenser to the first tank in response to an increase in the primary thermal load; and transferring heat from the primary fluid to the TES medium across the VCS-TES condenser, which is in fluid communication with the TES loop upstream of the first tank.

A nineteenth aspect relates to the method of any of aspects 12 to 18, further comprising: transferring heat from the TES medium to a second VCS loop across a second TES evaporator in the TES loop downstream of and in fluid communication with the first TES evaporator and upstream of and in fluid communication with the second tank; and transferring heat from the second VCS loop to the primary fluid across a second VCS condenser in the first-TES-evaporator branch and upstream of or downstream of and in fluid communication with the first TES evaporator.

A twentieth aspect relates to the method of any of aspects 12 to 19, further comprising: setting a second three-way valve in the TES loop to divert flow of the TES medium from the first tank to a junction-three-way-valve conduit and bypass the first TES evaporator; setting a third three-way valve in the TES lop to stop flow of the TES medium from the first tank and open to flow of the TES medium from the second tank; wherein the second three-way valve is downstream of and in fluid communication with the first tank, upstream of and in fluid communication with the first TES evaporator, and in fluid communication with a conduit junction downstream of the first TES evaporator by the junction-three-way-valve conduit; wherein the third three-way valve is downstream of and in fluid communication with an outlet of the first tank, upstream of and in fluid communication with the first liquid pump, and in fluid communication with an outlet of the second tank; wherein the temperature of the TES medium in the second tank is at a temperature at least a predetermined temperature difference lower than the temperature of the TES medium in the first tank; and wherein the temperature of the TES medium in the second tank is at or above a second predetermined temperature set point.

In addition to the features mentioned in each of the independent aspects enumerated above, some examples may show, alone or in combination, the optional features mentioned in the dependent aspects and/or as disclosed in the description above and shown in the figures.

What is claimed is:

1. A thermal management system, comprising:
   a thermal energy storage ("TES") loop comprising a TES medium disposed in the TES loop, a two-phase pump loop ("TPPL") condenser, a first tank, a first liquid pump, a first TES evaporator, a second tank, and a second liquid pump; and
   a primary fluid flow path comprising a primary fluid disposed in the primary fluid flow path, a TPPL, a vapor compression system ("VCS") loop, an accumulator, and a first-TES-evaporator branch; and
   wherein the TPPL is configured to cool a primary thermal load, the TPPL comprising a TPPL liquid pump and the TPPL condenser, the TPPL condenser configured to transfer heat from the primary fluid in the TPPL to the TES medium;
   wherein the VCS loop is configured to transfer heat from the primary fluid in the primary fluid flow path to an ambient environment via a VCS condenser;
   wherein the accumulator is configured to separate the primary fluid received from the TPPL and the VCS loop into a vapor-phase primary fluid and a liquid-phase primary fluid;
   wherein the first-TES-evaporator branch comprises the first TES evaporator and is in fluid communication with the TPPL downstream of the accumulator and with the VCS loop upstream of a compressor, wherein the first TES evaporator is configured to transfer heat from the TES medium to the VCS loop;
   wherein the TES loop is configured to, during operation of the thermal management system, transfer heat to the ambient environment via the VCS loop and maintain the primary fluid supplied to the primary thermal load in the TPPL at a substantially constant temperature; and
   wherein the VCS loop and the TES loop are configured to, during operation of the thermal management system, maintain the TES medium in the second tank at a temperature that is lower than a temperature of the TES medium in the first tank.

2. The thermal management system of claim 1, further comprising:
   a secondary load cooling loop configured to cool a secondary thermal load, the secondary load cooling loop comprising a fluid disposed in the secondary load cooling loop, a secondary evaporator, and a pump;
   a secondary-evaporator branch in fluid communication with the first-TES-evaporator branch, at points upstream and downstream of the first TES evaporator, the secondary-evaporator branch comprising a secondary evaporator in parallel with the first TES evaporator, the secondary evaporator configured to transfer heat from the secondary thermal load to the VCS loop; and
   an expansion valve disposed on the secondary-evaporator branch upstream of the secondary evaporator and configured to expand the vapor-phase primary fluid.

3. The thermal management system of claim 1,
   wherein the TES loop further comprises a conduit junction, a mix valve, and a TES medium flowpath extending from an outlet of the TPPL condenser to an inlet of the TPPL condenser, the TES medium flowpath comprising, in a direction of TES medium flow: the conduit junction, the first tank, the first liquid pump, the first TES evaporator, the second tank, the mix valve, and the second liquid pump;
   wherein the conduit junction is in fluid communication with the mix valve by a junction-mix-valve conduit; and wherein the mix valve is configured to control the temperature of the TES medium that flows to the TPPL condenser by mixing the TES medium flowing from the TPPL condenser through the junction-mix-valve conduit with the TES medium from the second tank.

4. The thermal management system of claim 1, wherein the TES loop further comprises a three-way valve downstream of and in fluid communication with the first TES evaporator, upstream of and in fluid communication with the second tank, and in fluid communication with the first tank; and wherein the three-way valve is configured to at least partially divert delivery of the TES medium from the second tank to the first tank when the ambient temperature is at or below a predetermined temperature set point.

5. The thermal management system of claim 1, wherein the VCS loop comprises a VCS vapor-phase primary fluid flow path from the accumulator and returning to the accumulator, the VCS vapor-phase primary fluid flow path comprising, in a direction of VCS vapor-phase fluid flow, the compressor, the VCS condenser, and a VCS-TES condenser;

wherein the VCS-TES condenser is thermally coupled to the TES loop downstream of the first liquid pump and upstream of the first tank; and wherein the VCS-TES condenser is configured to transfer heat from the primary fluid to the TES medium.

6. The thermal management system of claim 5, wherein the TES loop further comprises a modulating valve upstream of, or downstream of, the VCS-TES condenser and upstream of the first tank; and wherein when the primary thermal load increases, the modulating valve is configured to increase flow of the TES medium through the VCS-TES condenser to the first tank.

7. The thermal management system of claim 1, further comprising:

a second VCS condenser disposed on the first-TES-evaporator branch upstream of, or downstream of, and in fluid communication with the first TES evaporator; and a second VCS loop, the second VCS loop comprising a VCS fluid disposed in the second VCS loop, the second VCS condenser, and a second TES evaporator;

wherein the TES loop comprises the second TES evaporator downstream of and in fluid communication with the first TES evaporator and upstream of and in fluid communication with the second tank, the second TES evaporator configured to transfer heat from the TES loop to the second VCS loop; and wherein the second VCS loop is configured to maintain the temperature of the TES medium in the second tank at a temperature lower than the temperature of the TES medium in the first tank during operation of the thermal management system, resulting in a predetermined temperature difference.

8. The thermal management system of claim 1, further comprising an expansion valve disposed on the first-TES-evaporator branch upstream of the first TES evaporator and configured to expand the vapor-phase primary fluid.

9. The thermal management system of claim 1, wherein the TES loop further comprises a first three-way valve and a second three-way valve;

wherein the first three-way valve is in fluid communication with the first liquid pump, in fluid communication with the first TES evaporator, and in fluid communication with a conduit junction downstream of the first TES evaporator by a junction-three-way-valve conduit;

wherein the second three-way valve is in fluid communication with an outlet of the first tank, in fluid communication with the first liquid pump, and in fluid communication with an outlet of the second tank;

wherein the first three-way valve is configured to divert the TES medium flowing from the first liquid pump to the junction-three-way-valve conduit and bypass the first TES evaporator when the TES medium in the second tank is at a temperature at or above a predetermined temperature set point; and wherein the second three-way valve is configured to close to flow of the TES medium from the outlet of the first tank and open to flow of TES medium from the second tank when the TES medium in the second tank is at the temperature at or above the predetermined temperature set point.

10. A method of transferring heat from one or more thermal loads to an ambient environment, comprising:

transferring heat from a primary thermal load to a primary fluid disposed in a two-phase pump loop ("TPPL") in fluid communication with a vapor compression system ("VCS") loop;

transferring heat across a TPPL condenser from the primary fluid to a thermal energy storage ("TES") medium disposed in a TES loop;

transferring heat from the TES medium to the primary fluid across a first TES evaporator in a first-TES-evaporator branch in fluid communication with the TPPL and the VCS loop;

transferring heat from the primary fluid to the ambient environment across a VCS condenser in the VCS loop; and maintaining a temperature of the TES medium in a second tank in the TES loop lower than a temperature of the TES medium in a first tank in the TES loop.

11. The method of claim 10, further comprising:

mixing the TES medium flowing from the TPPL condenser in the TES loop with the TES medium flowing from the second tank in a mix valve, so as to provide the TES medium to the TPPL condenser at a predetermined temperature difference above the temperature of the TES medium in the second tank.

12. The method of claim 10, further comprising:

expanding the primary fluid across a first expansion valve disposed on the first-TES-evaporator branch prior to transferring heat from the TES medium to vapor-phase primary fluid in the first TES evaporator.

13. The method of claim 10, further comprising:

transferring heat from a secondary thermal load in a secondary cooling loop to the primary fluid across a secondary evaporator in a secondary-evaporator branch in fluid communication with the first-TES-evaporator branch upstream and downstream of the first TES evaporator, the secondary evaporator parallel to the first TES evaporator.

14. The method of claim 10, further comprising:

expanding the primary fluid in an expansion valve disposed in the secondary-evaporator branch upstream of the secondary evaporator.

15. The method of claim 10, further comprising:

at least partially diverting delivery of the TES medium from the second tank to the first tank through a three-way valve in the TES loop in response to an ambient temperature being at or below a predetermined temperature set point, the three-way valve downstream of and in fluid communication with the first TES evaporator, upstream of and in fluid communication with the second tank, and in fluid communication with the first tank.

16. The method of claim 10, further comprising:
increasing flow of the TES medium through a modulating valve disposed on the TES loop through a VCS-TES condenser to the first tank in response to an increase in the primary thermal load; and
transferring heat from the primary fluid to the TES medium across the VCS-TES condenser, which is in fluid communication with the TES loop upstream of the first tank.

17. The method of claim 10, further comprising:
transferring heat from the TES medium to a second VCS loop across a second TES evaporator in the TES loop downstream of and in fluid communication with the first TES evaporator and upstream of and in fluid communication with the second tank; and
transferring heat from the second VCS loop to the primary fluid across a second VCS condenser in the first-TES-evaporator branch and upstream of, or downstream of, and in fluid communication with the first TES evaporator.

18. The method of claim 10, further comprising:
setting a first three-way valve in the TES loop to divert flow of the TES medium from the first tank to a junction-three-way-valve conduit and bypass the first TES evaporator;
setting a second three-way valve in the TES loop to stop flow of the TES medium from the first tank and open to flow of the TES medium from the second tank;
wherein the first three-way valve is downstream of and in fluid communication with the first tank, upstream of and in fluid communication with the first TES evaporator, and in fluid communication with a conduit junction downstream of the first TES evaporator by the junction-three-way-valve conduit;
wherein the second three-way valve is downstream of and in fluid communication with an outlet of the first tank, upstream of and in fluid communication with the first liquid pump, and in fluid communication with an outlet of the second tank;
wherein the temperature of the TES medium in the second tank is at a temperature lower than the temperature of the TES medium in the first tank, resulting in a predetermined temperature difference; and
wherein the temperature of the TES medium in the second tank is at or above a predetermined temperature set point.

19. A thermal management system, comprising:
a thermal energy storage ("TES") loop comprising a TES medium disposed in the TES loop, a two-phase pump loop ("TPPL") condenser, a first tank, a first liquid pump, a first TES evaporator, a second tank, and a second liquid pump;
a primary fluid flow path, comprising:
a primary fluid disposed in the primary fluid flow path;
a TPPL, the TPPL configured to cool a primary thermal load, the TPPL comprising a TPPL liquid pump and the TPPL condenser configured to transfer heat from the primary fluid in the TPPL to the TES medium;
a vapor compression system ("VCS") loop, the VCS loop configured to transfer heat from the primary fluid in the VCS loop to an ambient environment via a VCS condenser;
an accumulator configured to separate the primary fluid received from the TPPL and the VCS loop into a vapor-phase primary fluid and a liquid-phase primary fluid, the accumulator in fluid communication with the TPPL and the VCS loop; and
a first-TES-evaporator branch comprising the primary fluid and the first TES evaporator and in fluid communication with the TPPL downstream of the accumulator and with the VCS loop upstream of a compressor, the first TES evaporator configured to transfer heat from the TES medium to the VCS loop; and
a processor configured to cause:
the TPPL to transfer heat from the primary thermal load to the primary fluid;
the TPPL condenser to transfer heat from the primary fluid to the TES medium;
the first TES evaporator to transfer heat from the TES medium to the primary fluid;
the VCS condenser to transfer heat from the primary fluid to the ambient environment;
the TES loop to transfer heat to the ambient environment via the VCS loop and to maintain the primary fluid supplied to the primary thermal load at a substantially constant temperature; and
the TES loop and the VCS loop to maintain a temperature of the TES medium in the second tank lower than a temperature of the TES medium in the first tank.

20. The thermal management system of claim 19, further comprising:
a secondary-evaporator branch in fluid communication with the first-TES-evaporator branch upstream and downstream of the first TES evaporator and comprising a secondary evaporator in parallel to the first TES evaporator, the secondary evaporator configured to transfer heat from a secondary thermal load to the VCS loop; and
wherein the processor is further configured to cause the secondary evaporator to transfer heat from the secondary thermal load to the primary fluid.

* * * * *